(12) United States Patent
Vallius et al.

(10) Patent No.: US 8,264,765 B2
(45) Date of Patent: Sep. 11, 2012

(54) STABILIZED LIGHT SOURCE

(75) Inventors: Tuomas Vallius, Tampere (FI); Pietari Tuomisto, Tampere (FI); Janne Konttinen, Tampere (FI)

(73) Assignee: EpiCrystals Oy, Tampere (FI)

( * ) Notice: Subject to any disclaimer, the term of this patent is extended or adjusted under 35 U.S.C. 154(b) by 0 days.

(21) Appl. No.: 12/872,074

(22) Filed: Aug. 31, 2010

(65) Prior Publication Data
US 2011/0051226 A1    Mar. 3, 2011

Related U.S. Application Data

(60) Provisional application No. 61/238,253, filed on Aug. 31, 2009.

(51) Int. Cl.
*G02F 1/365* (2006.01)
*G02F 1/35* (2006.01)

(52) U.S. Cl. ........... 359/326; 372/22; 372/102; 359/328

(58) Field of Classification Search .......... 359/326–332; 372/21, 22, 99, 102, 105
See application file for complete search history.

(56) References Cited

U.S. PATENT DOCUMENTS

| | | | |
|---|---|---|---|
| 5,301,059 A | 4/1994 | Kitaoka et al. | |
| 5,448,398 A | 9/1995 | Asakura et al. | |
| 6,710,914 B2 * | 3/2004 | Arbore et al. | 359/330 |
| 6,996,140 B2 * | 2/2006 | Waarts et al. | 372/21 |
| 7,386,021 B2 * | 6/2008 | Kashyap | 372/34 |
| 7,576,908 B2 * | 8/2009 | Shikii et al. | 359/326 |
| 7,605,973 B2 * | 10/2009 | Sakai et al. | 359/326 |
| 7,859,744 B2 * | 12/2010 | Trifonov | 359/332 |
| 2004/0008742 A1 | 1/2004 | Chou et al. | |
| 2006/0023757 A1 | 2/2006 | Mooradian et al. | |
| 2006/0029120 A1 | 2/2006 | Mooradian et al. | |
| 2008/0316485 A1 | 12/2008 | Wawro et al. | |
| 2010/0290105 A1 * | 11/2010 | Furuya et al. | 359/328 |

FOREIGN PATENT DOCUMENTS

| | | |
|---|---|---|
| EP | 0 473 441 A2 | 3/1992 |
| JP | 10133243 | 5/1998 |
| JP | 2010093211 | 4/2010 |
| WO | WO-02/101895 A2 | 12/2002 |
| WO | WO-2008/015951 A1 | 2/2008 |
| WO | WO-2008/087253 A1 | 7/2008 |

(Continued)

OTHER PUBLICATIONS

Notification of Transmittal of the International Search Report and The Written Opinion of the International Searching Authority, or the Declaration, dated Jan. 7, 2011, issued in connection with counterpart International Application No. PCT/FI2010/050674.

(Continued)

*Primary Examiner* — Daniel Petkovsek
(74) *Attorney, Agent, or Firm* — Venable LLP; Eric J. Franklin

(57) ABSTRACT

A light source including a light emitting unit, a nonlinear medium, and a resonant grating. The light emitting unit is arranged to emit a first light into the nonlinear medium. The nonlinear medium is arranged to generate a second light such that an optical frequency of the second light is higher than an optical frequency of the first light. The resonant grating is arranged to stabilize an optical frequency of the first light by providing optical feedback to the light emitting unit.

19 Claims, 11 Drawing Sheets

FOREIGN PATENT DOCUMENTS

WO    WO-2008/142210 A1    11/2008

OTHER PUBLICATIONS

International Search Report, dated Jan. 7, 2011, issued in connection with counterpart International Application No. PCT/FI2010/050674.

Written Opinion of the International Searching Authority, dated Jan. 7, 2011, issued in connection with counterpart International Application No. PCT/FI2010/050674.

Ahmed, A.M. et al., "Wavelength-selective grating mirrors for high-power think-disk lasers," In: European Conference on Lasers and Electro-Optics and the European Quantum Electronics Conference, 2009 (publication date Jun. 14, 2009).

Avrutsky, I., et al., "Waveguide grating mirror for large-area semi-conductor lasers," *Optics Letters*, vol. 26, No. 13, p. 989, Jul. 1, 2001.

Block, S., et al., "Semiconductor Laser With External Resonant Grating Mirror," *Journal of Quantum Electronics*, vol. 41, No. 8, p. 1049, Aug. 2005.

Mehta, A., et al., "Guided Mode Resonance Filter as a Spectrally Selective Feedback Element in a Double-Cladding Optical Fiber Laser," *IEEE Photonics Technology Letters*, vol. 19, No. 24, p. 2030, Dec. 15, 2007.

Extended Search Report issued by the European Patent Office on Jan. 25, 2012, in connection with counterpart European Application No. EP 10 39 7514.

Alok, et al., "Guided Mode Resonance Filter as a Spectrally Selective Feedback Element in a Double-Cladding Optical Fiber Laser," *IEEE Photonics Technology Letters*, IEEE Service Center, Piscataway, NJ (US), vol. 19, No. 24, Dec. 15, 2007, pp. 2030-2032.

Chang, et al., "Tunable External Cavity Laser With a Liquid-Crystal Subwavelength Resonant Grating Filter as Wavelength-Selective Mirror," *IEEE Photonics Technology Letters*, IEEE Service Center, Piscataway, NJ (US), vol. 19, No. 14, Jul. 15, 2007, pp. 1099-1101.

\* cited by examiner

STABILIZED LIGHT SOURCE

CROSS-REFERENCE TO RELATED APPLICATIONS

This application claims priority to U.S. provisional patent application 61/238,253 filed 31 Aug. 2009.

FIELD OF THE INVENTION

The present invention relates to light sources adapted to emit light for visual applications.

BACKGROUND OF THE INVENTION

An image projector may comprise a light source to provide light for a modulator array. Light transmitted or reflected from the pixels of said modulator array may be subsequently projected on an external screen by projecting optics in order to display images.

The high optical intensity and the low divergence provided by a laser light source would be attractive properties when implementing an image projector. However, the wavelengths of powerful semiconductor laser emitters are typically in the red or infrared (IR) regions.

It is known that blue and/or green light for visual applications may be generated by frequency-doubling. Patent publication US 2006/23757 discloses a mode-locked surface-emitting laser having a nonlinear crystal for frequency-doubling.

WO 2008/087253 discloses that a frequency-doubled light source may be stabilized by using a Bragg grating to provide optical feedback.

SUMMARY OF THE INVENTION

An object of the invention is to provide a stabilized light source for visual applications.

According to a first aspect of the invention, there is provided a light source comprising:
- a light emitting unit,
- a nonlinear medium, and
- a resonant grating, wherein said light emitting unit is arranged to emit first light into said nonlinear medium, said nonlinear medium is arranged to generate second light such that the optical frequency of said second light is higher than the optical frequency of said first light, and the resonant grating is arranged to stabilize the optical frequency of said first light by providing optical feedback to said light emitting unit.

According to a second aspect of the invention, there is provided a method for generating light by using a light emitting unit, a nonlinear medium, and a resonant grating, said method comprising:
- emitting first light from said light emitting unit into said nonlinear medium,
- generating second light in said nonlinear medium such that the optical frequency of said second light is higher than the optical frequency of said first light, and
- providing optical feedback to said light emitting unit by said resonant grating so as to stabilize the optical frequency of said first light.

Mechanical alignment of a resonant grating may be easier than mechanical alignment of an external Bragg grating with respect to a nonlinear crystal, wherein said external Bragg grating is separate from said nonlinear crystal.

A light source with a resonant grating may be more compact than a light source with an external Bragg grating.

A light source with a resonant grating may be more stable than a light source stabilized with an external Bragg grating, because the operating temperature of the resonant grating may be kept closer to the operating temperature of the nonlinear medium.

Mechanical alignment of a resonant grating with respect to a nonlinear crystal may be easier than implementing a Bragg grating on the surface of a nonlinear crystal.

The use of a resonant grating for frequency stabilization provides more freedom to select optical materials than implementing a Bragg grating on the surface of a nonlinear crystal. As a consequence, this allows considerable freedom to match the temperature-dependent behavior of the resonant grating with the temperature-dependent behavior of the nonlinear crystal.

The embodiments of the invention and their benefits will become more apparent to a person skilled in the art through the description and examples given herein below, and also through the appended claims.

BRIEF DESCRIPTION OF THE FIGURES

In the following examples, the embodiments of the invention will be described in more detail with reference to the appended drawings in which.

DETAILED DESCRIPTION

Figure 1:
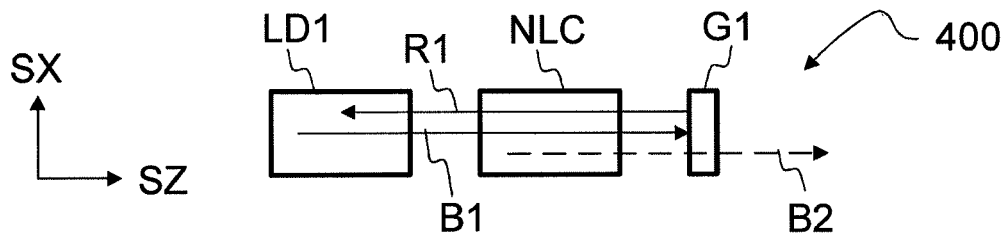
FIG. 1 shows a light source comprising a resonant grating and a nonlinear crystal.

Referring to FIG. 1, a light source 400 may comprise a light emitting unit LD1, a nonlinear medium NLC, and a resonant grating G1. The light emitting unit LD1 may be a semiconductor laser, e.g. a diode laser. The nonlinear medium NLC may be a nonlinear crystal. The resonant grating G1 may also be called as a guided-mode resonance filter.

The light emitting unit LD1 may be arranged to emit first light B1 directly or indirectly into the nonlinear medium NLC.

The nonlinear medium may be arranged to generate second light B2 by sum frequency generation (SFG), in particular by second harmonic generation (SHG). Thus, the optical frequency of the second light B2 may be higher than the optical frequency of the first light B1. In particular, the optical frequency of the second light B2 may be equal to two times the optical frequency of the first light B1. In other words, the wavelength of the first light may be equal to two times the wavelength of the second light (when they hypothetically propagate in vacuum).

The optical frequency of the second light B2 may be equal to three times or four times the optical frequency of the first light B1.

The resonant grating G1 may be arranged to provide optical feedback to the light emitting unit LD1 so as to stabilize the optical frequency of the first light B1. In particular, the resonant grating G1 may be arranged to reflect a predetermined part of the spectrum of the first light B1 through the nonlinear medium NLC back to the light emitting unit LD1.

Figure 2A:
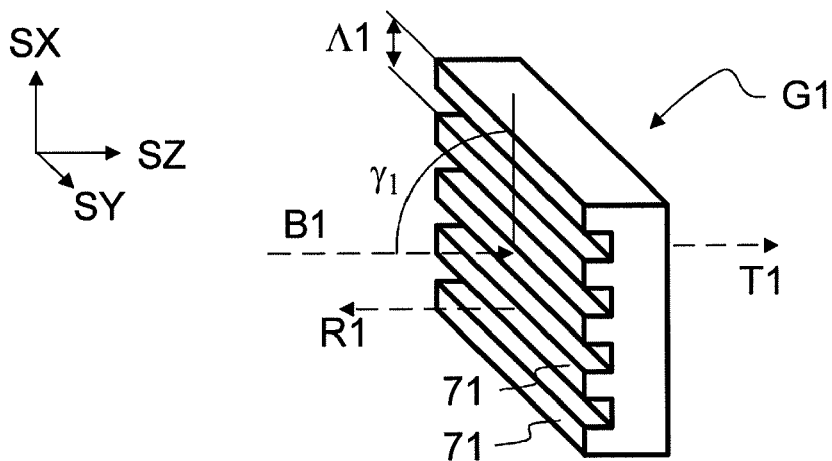
FIG. 2a shows a resonant grating, which is periodic in one dimension.

Referring to FIG. 2a, the resonant grating G1 may comprise a plurality of substantially linear diffractive features 71, which are periodically arranged so as to form a diffractive grating. $\Lambda_1$ denotes the period of the diffractive features in the direction SX. The diffractive features 71 may be e.g. microscopic ridges or grooves. The diffractive features 71 may be e.g. substantially parallel to the direction SY. Light B1 may impinge on the grating G1. $\gamma_1$ denotes an angle between the plane of the grating G1 and the direction SZ. T1 denotes transmitted light and R1 denotes reflected light. The reflected light R1 is parallel to the in-coming light B1 when the in-coming light is perpendicular to the plane of the grating G1.

SX, SY, and SZ denote orthogonal directions.

The diffractive features 71 may form e.g. a rectangular (i.e. binary), sinusoidal, blazed, or trapezoidal grating profile.

Figure 2B:
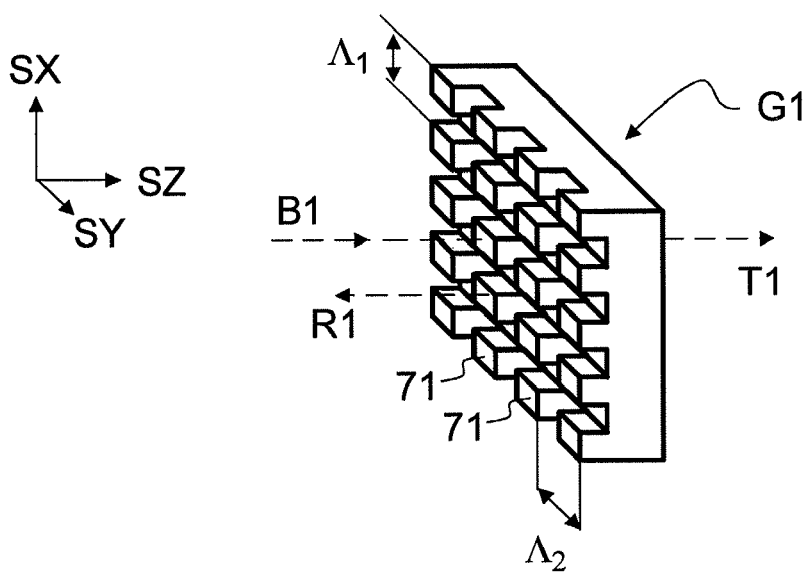
FIG. 2b shows a resonant grating, which is periodic in two dimensions.

Referring to FIG. 2b, a resonant grating G2 may also be periodic in two dimensions, i.e. in the directions SX and SY. $\Lambda_2$ denotes the period in the direction SY. In that case the diffractive features 71 may be e.g. microscopic studs or pits.

Figure 7A:
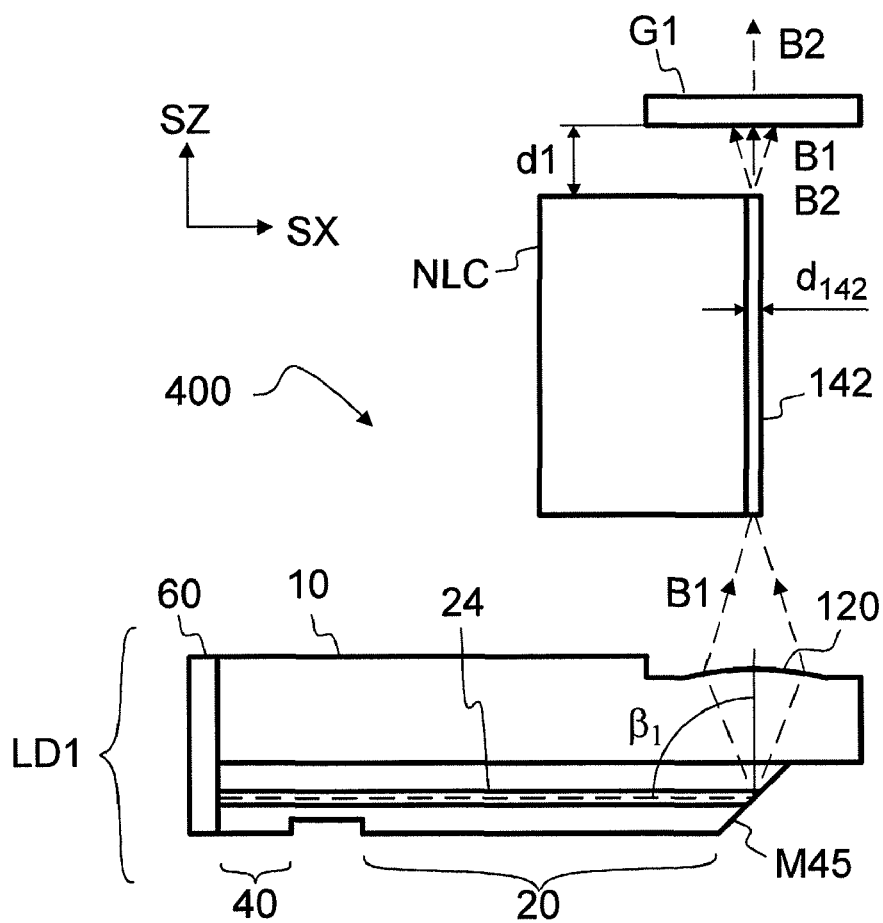
FIG. 7a shows a light source in a folded configuration, said light source comprising a saturable absorber, gain medium, nonlinear crystal, and a resonant grating, wherein said resonant grating is arranged to provide feedback through said nonlinear crystal.

The light source LD1 may comprise light-amplifying medium, i.e. a gain region 20 (See FIG. 7a). Seed light propagating in the gain region 20 may induce stimulated emission of first light B1. Referring to the uppermost curve of FIG. 3, the optical amplification $I_1/I_{SEED}$ in the gain region 20 is wavelength-dependent. $I_1$ denotes the intensity of the first light B1 generated in the gain region 20, and $I_{SEED}$ denotes the intensity of the seed light. The optical gain has a maximum at a wavelength $\lambda_{AMP}$.

Figure 3:
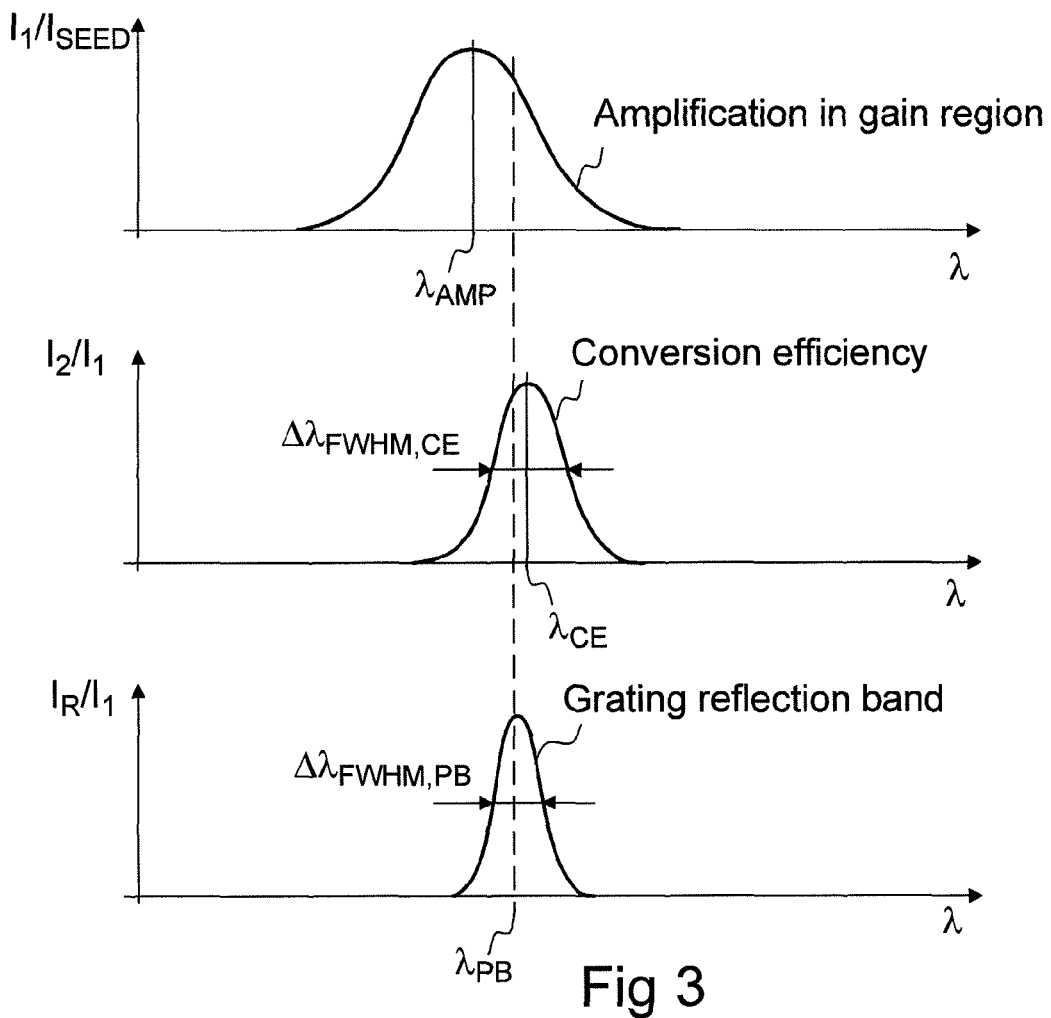
FIG. 3 shows the spectral dependency of amplification in a gain medium, the spectral dependency of conversion efficiency of a nonlinear crystal, and the spectral dependency of the reflection band of a resonant grating.

Referring to the second curve of FIG. 3, the optical conversion efficiency $I_2/I_1$ in the nonlinear medium NLC is also wavelength-dependent. The conversion efficiency may have a maximum at a wavelength $\lambda_{CE}$. $I_1$ denotes the intensity of first light B1 propagating in the nonlinear medium NLC and $I_2$ denotes the intensity of second light B2 generated in the nonlinear medium NLC.

Referring to the lowermost curve of FIG. 3, the resonant grating G1 has a wavelength-dependent reflectance. $I_R$ denotes the intensity of light reflected by the resonant grating G1 and $I_1$ denotes the intensity of first light B1 impinging on the resonant grating G1. The reflection band may have a maximum at wavelength $\lambda_{PB}$. FIG. 3 shows a reflection band for reflected light R1. Alternatively, a resonant grating G1 may have a passband for transmitted light T1.

The FWHM width $\Delta\lambda_{FWHM,PB}$ of the reflection band may be e.g. in the range of 0.1 nm to 1 nm, e.g. in the range of 1 nm to 10 nm, or even in the range of 10 nm to 100 nm. FWHM is an acronym for full width at half maximum.

In practice, the spectral FWHM width of the first light B1 is typically slightly smaller than the FWHM width $\Delta\lambda_{FWHM,PB}$ of the reflection band.

The FWHM width $\Delta\lambda_{FWHM,PB}$ of the reflection band (passband) may be e.g. in the range of 50% to 150% of the FWHM width $\Delta\lambda_{FWHM,CE}$ of the conversion efficiency curve (the second curve of FIG. 3) in order to minimize the speckle contrast and/or in order to ensure operation in a wide range of operating temperatures. Advantageously, the FWHM width $\Delta\lambda_{FWHM,PB}$ of the reflection band may be in the range of 50% to 120% of the FWHM width $\Delta\lambda_{FWHM,CE}$ of the conversion efficiency curve. A broader spectrum of the first light B1 may provide a lower speckle contrast of the second light B2 than a narrower spectrum. Furthermore, a broader reflection band may at least partially overlap the conversion efficiency curve in a wide temperature range when the width $\Delta\lambda_{FWHM,PB}$ of the reflection band is in the same order of magnitude as the width $\Delta\lambda_{FWHM,CE}$ of the conversion efficiency curve.

On the other hand, the FWHM width $\Delta\lambda_{FWHM,PB}$ of the reflection band may be e.g. smaller than or equal to the FWHM width $\Delta\lambda_{FWHM,CE}$ of the conversion efficiency curve (the second curve of FIG. 3) in order to stabilize the light source 400 to an operating point which is near the maximum conversion efficiency, i.e. to maximize the optical output power. In particular, the FWHM width of the reflection band is smaller than or equal to 50% the FWHM width of the conversion efficiency curve.

The spectral position $\lambda_{PB}$ of the reflection band may be selected or adjusted by selecting the period $\Lambda_1$ and/or by selecting the materials of the resonant grating G1. The temperature of the grating G1 may have an effect on the period $\Lambda_1$, and consequently on the spectral position $\lambda_{PB}$.

The spectral position $\lambda_{CE}$ of maximum conversion efficiency may be selected e.g. by selecting the poling period of a periodically poled nonlinear crystal and/or by selecting the material of the nonlinear crystal. The temperature of the nonlinear crystal may have an effect on the spectral position $\lambda_{CE}$. The temperature-induced shift of $\lambda_{CE}$ per unit temperature change may be e.g. in the order of 0.09 nm/° C.

Without stabilization, the temperature-induced shift of the wavelength $\lambda_{AMP}$ of emitted first light B1 per unit temperature change may be e.g. in the order of 0.3 nm/° C.

Figure 4:
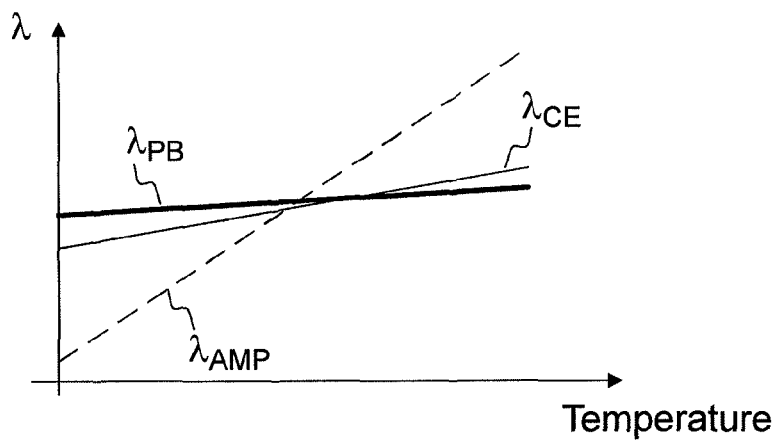
FIG. 4 shows the effect of temperature on the spectral position of the maximum amplification, on the spectral position of the maximum conversion efficiency, and on the spectral position of the reflection band.

Referring to FIG. 4, the spectral position $\lambda_{AMP}$ of maximum amplification and the spectral position $\lambda_{CE}$ of maximum conversion efficiency may depend on the temperature such that a change of $\lambda_{AMP}$ is substantially greater than a change of $\lambda_{CE}$ (or vice versa). As a consequence, the wavelength of the first light B1 emitted by the light emitting unit LD1 may drift so that the intensity of the second light B2 generated in the nonlinear crystal NLC becomes unstable. The problem may get even worse when the output of the light emitting unit LD1 is modulated.

An image projector may comprise e.g. three light sources 400. The image projector may comprise e.g. one light source 400 for generating red light R, one light source 400 for generating green light G and one light source 400 for generating blue light. Unstable output may cause problems with color reproduction when a light source 400 is used as a part of a color projection system.

The spectral position of the first light B1 generated in the gain region 20 may be stabilized by defining the wavelength of the seed light. A part of the first light B1 may be reflected (or transmitted) by a resonant grating G1, and the reflected (or transmitted) light may be used as seed light in the gain region 20.

The resonant grating G1 may be dimensioned such that the spectral position $\lambda_{CE}$ of maximum conversion efficiency of the nonlinear medium NLC coincides with the spectral position $\lambda_{PB}$ of the reflection band of the resonant grating G1 when the light emitting unit 400 operates at a maximum power rated for continuous operation.

The resonant grating G1 may be dimensioned such that the spectral position $\lambda_{CE}$ of maximum conversion efficiency of the nonlinear medium NLC coincides with the spectral position $\lambda_{PB}$ of the reflection band of the resonant grating G1 at a predetermined temperature of the nonlinear medium NLC. Said predetermined temperature may be e.g. in the range of $T_{MAX}-10°$ C. to $T_{MAX}+10°$ C., where $T_{MAX}$ denotes the operating temperature of the nonlinear medium NLC when the light emitting unit 400 operates at the maximum power rated for continuous operation.

The term "continuous operation" may also include a situation where the second light B2 is emitted as pulsed light.

"Maximum power" refers herein to the maximum average optical power of visible light which can be generated by the light source during a period of 100 hours.

The light source 400 may be arranged such that the operating temperature of the resonant grating G1 depends on the operating temperature nonlinear crystal NLC. For example, the nonlinear crystal NLC, and the resonant grating G1 may be positioned in the same housing 412 (See FIG. 10). They may even be mounted on the same heat-conductive body. The light source 400 may even be arranged such that the operating temperature of the resonant grating G1 is substantially equal to the operating temperature of the nonlinear crystal NLC.

Consequently, when the operating temperature is changed, the spectral position $\lambda_{PB}$ of the reflection band and the wavelength of the first light B1 may follow the spectral position $\lambda_{CE}$ of maximum conversion efficiency.

The spectral shift of maximum conversion efficiency of the nonlinear medium NLC per unit temperature change (nm/° C.) may be e.g. in the range of 50% to 200% of the spectral shift of the reflection band of the resonant grating G1 per unit temperature change (nm/° C.). Advantageously, the spectral shift of maximum conversion efficiency of the nonlinear medium NLC per unit temperature change (nm/° C.) may be e.g. in the range of 80% to 120% of the spectral shift of the reflection band of the resonant grating G1 per unit temperature change (nm/° C.).

Thus, the intensity of the second light B2 generated by the light source 400 depends less on the operating temperature of the nonlinear crystal and on the operating temperature of the gain medium 20 than without using a resonant grating G1 for wavelength stabilization.

The resonant grating G1 may be dimensioned such that the spectral position $\lambda_{CE}$ of maximum conversion efficiency substantially coincides with the spectral position $\lambda_{PB}$ of the reflection band in at least one operating point of the light source 400. The operating point may be characterized e.g. by the operating temperature of the nonlinear medium NLC, and by the operating temperature of the resonant grating G1. The spectral positions $\lambda_{CE}$ and $\lambda_{PB}$ may coincide when the temperature of the nonlinear medium NLC is equal to a predetermined operating temperature of the nonlinear medium NLC, and the temperature of the resonant grating G1 is equal to a predetermined operating temperature of the resonant grating G1.

The resonant grating G1 may be dimensioned such that the spectral position $\lambda_{CE}$ of maximum conversion efficiency coincides with the spectral position $\lambda_{PB}$ of the reflection band when the temperature of the resonant grating G1 is equal to the temperature of the nonlinear medium NLC, and wherein the difference between the temperature $T_{MAX}$ and the temperature of the nonlinear medium NLC is smaller than or equal to 10° C.

The resonant grating G1 may be dimensioned such that the spectral position $\lambda_{CE}$ of maximum conversion efficiency coincides with the spectral position $X_{PB}$ of the reflection band when the difference between the temperature of the nonlinear medium NLC and the temperature of the resonant grating G1 is smaller than or equal to 10° C., and wherein the difference between the temperature $T_{MAX}$ and the temperature of the nonlinear medium NLC is smaller than or equal to 10° C.

In steady state operation of the light source 400, the operating temperature of the resonant grating G1 may be expressed as a function of the operating temperature of the nonlinear medium NLC.

Figure 5A:
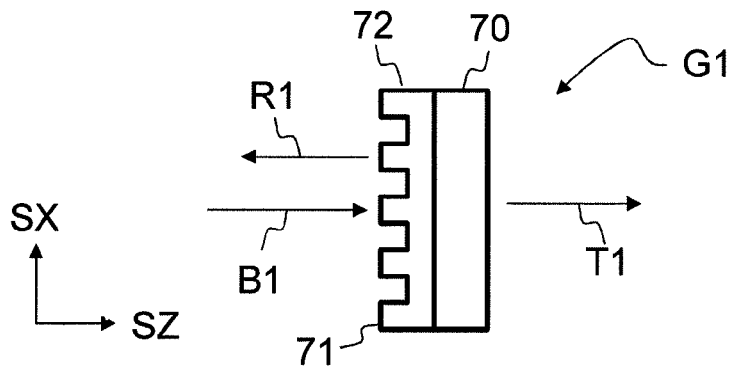
FIG. 5a shows a reflective resonant grating comprising diffractive ridges and grooves implemented in a waveguiding layer.

FIG. 5a shows a resonant grating G1 comprising a substantially planar waveguide 72, i.e. a waveguiding layer implemented on a substrate 70. The waveguide 72 has a plurality of diffractive features 71 for coupling light into the waveguide 72 and out of the waveguide 72. The refractive index of the substrate 70 may be lower than the refractive index of the waveguide 72.

The operation of a resonant grating is based on the excitation of a leaky waveguide mode. The operating principle of a resonant grating is fundamentally different from that of a multilayer thin-film reflector.

A part of the incoming light B1 is trapped into the waveguide 72 via evanescent grating coupling. The in-coupled light propagates transversely in the waveguide 72, e.g. in the direction SX and in the direction −SX (i.e. opposite the direction SX). The in-coupled light is also coupled out of the waveguiding layer 72. The out-coupled light R1 interferes destructively with the incoming light B1 within a very limited range of parameters, similar to a resonance condition. Outside this resonance region, the in-coming light B1 is not coupled into the waveguide, and it is transmitted and reflected as from a regular stratified layer. Thus, the resonant grating G1 may be arranged to reflect only a narrow part of the spectrum, wherein the rest of the spectrum may be transmitted through the resonant grating G1. T1 denotes transmitted light.

It is also possible to design transmissive resonant gratings, which transmit only a narrow part of the spectrum, while the rest of the spectrum may be reflected. Thus, a light source 400 may also comprise a resonant grating, which has a narrow transmission band so as to provide optical feedback. Angular positioning of transmissive components is typically less demanding than angular positioning of reflective components. However, reflective resonant gratings may be implemented by using fewer structural layers. An external reflector may be used in combination with a transmissive resonant grating, in order to provide optical feedback.

In general, a resonant grating G1 provides a narrow passband, which may be a reflection passband or a transmission passband.

Theories explaining the operation of resonant gratings G1 have been discussed e.g. in articles "Coupled-mode theory of resonant grating filters", by S. M. Norton, T. Erdogan, and G. M. Morris, in J. Opt. Soc. Am A, Vol. 14, No. 3, March 1997, pp. 629-638, and "Phenomenological theory of filtering by resonant dielectric gratings", by A.-L. Fehrembach, D. Maystre, A. Sentenac, in J. Opt. Soc. Am A, Vol. 19, No. 6, June 2002, pp. 1136-1144.

Figure 5B:
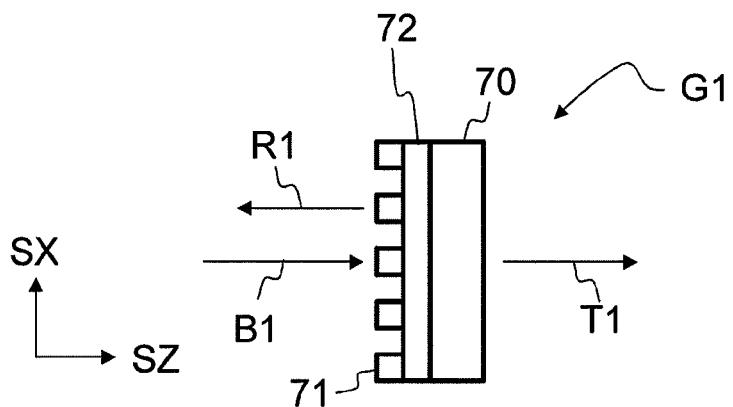
FIG. 5b shows a reflective resonant grating comprising diffractive ridges implemented on a waveguiding layer.

FIG. 5b shows a resonant grating G1 comprising a substantially planar waveguide 72 implemented on a substrate 70. Diffractive features 71 may be implemented on the waveguide 72. The refractive index of the substrate 70 may be lower than the refractive index of the waveguide 72. The refractive index of the diffractive features 71 may be lower than the refractive index of the waveguide 72.

Figure 5C:
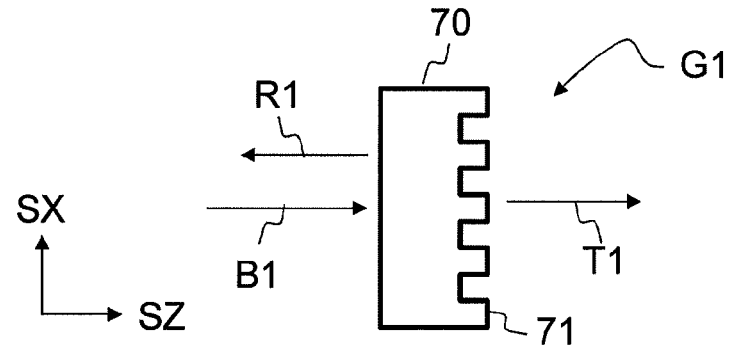
FIG. 5c shows a reflective resonant grating comprising diffractive ridges and grooves implemented in a substrate.

Referring to FIG. 5c, a reverse surface of a substrate 70 may comprise diffractive features 71 so as to implement a resonant grating G1. Thus, the reflected light R1 is transmitted through the substrate 70. In this case, a waveguiding layer is effectively formed in the vicinity of the diffractive features 71, when the operating parameters fulfill the resonance condition.

Figure 5D:
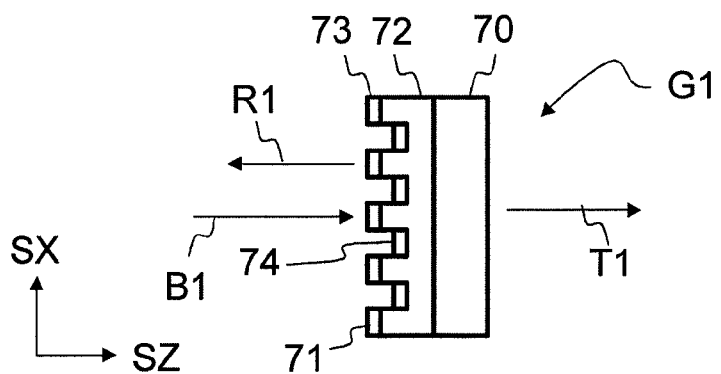
FIG. 5d shows a reflective resonant grating comprising diffractive ridges and grooves implemented in a waveguiding layer, wherein said ridges and grooves have been coated with a cladding layer.

Referring to FIG. 5d, a resonant grating G1 may comprise a waveguide 72 implemented on a substrate 70. The waveguide 72 may comprise diffractive features 71, e.g. microscopic ridges and grooves. The ridges and the grooves may be at least partially covered with a cladding layer 73. The refractive index of the substrate 70 may be lower than the refractive index of the waveguide 72. The refractive index of the cladding layer 73 may be lower than the refractive index of the waveguide 72.

Figure 6:
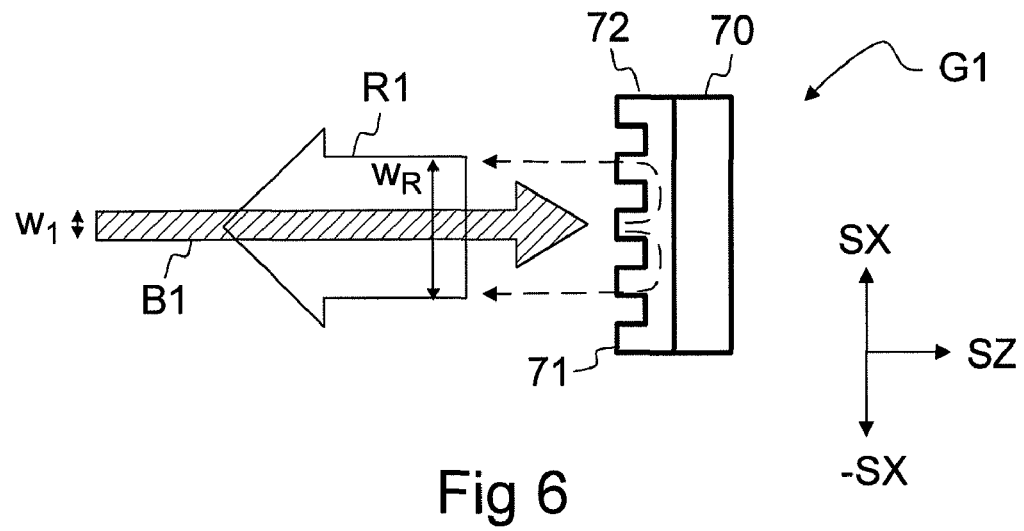
FIG. 6 shows lateral spreading of light in a resonant grating.

Referring to FIG. 6, propagation of light in the waveguide 72 of the resonant grating G1 may cause lateral spreading of reflected light in the directions SX and −SX. Consequently, the width $w_R$ of a reflected light beam R1 may be greater than the width $w_1$ of an in-coming light beam B1.

On the other hand, the angular divergence of the reflected light beam R1 may be substantially smaller than the angular divergence of the in-coming beam B1, because the resonance condition is fulfilled only in a very narrow range of parameters.

FIG. 7a shows positioning of a reflective resonant grating G1 in the vicinity of an output facet of a nonlinear crystal NLC.

The nonlinear medium NLC may be a nonlinear crystal, which has a waveguiding layer 142. In particular, the waveguiding layer 142 may comprise nonlinear material.

The light emitting unit LD1 may comprise:
a waveguide 24 having an electrically pumped gain region 20,
a saturable absorber 40,
a coupling structure M45,
a light-concentrating structure 120,
a substrate 10, and
a reflector 60.

The saturable absorber 40 and the gain region 20 may be arranged to emit first pulsed light B1, which may be guided into a waveguide 142 of the nonlinear crystal NLC by the coupling structure 45 and the light-concentrating structure 120.

The light source 400 may be adapted to emit short light pulses B1 and/or B2 at a high repetition rate. The duration of the light pulses may be e.g. in the range of 500 fs to 1 ns. The repetition rate of the pulses may be e.g. in the order of 100 MHz to 100 GHz. Furthermore, the output of the light source 400 may be modulated extremely fast by adjusting the bias voltage of the saturable absorber 40.

The substrate 10 may be e.g. gallium arsenide (GaAs), gallium indium arsenide (GaInAs) or Indium phosphide (InP).

The light-concentrating structure 120 may collect first light B1 into the nonlinear medium NLC, in particular into the waveguide 142. The light-concentrating structure 120 may collimate or focus light into the nonlinear medium NLC.

The light concentrating structure 120 may be e.g. a refractive lens which has been etched on the substrate 10. Alternatively, the light concentrating structure 120 may be a diffractive lens.

The combination of the saturable absorber 40 and the reflector 60 is also known as a semiconductor saturable absorber mirror (SESAM).

The coupling structure M45 may be e.g. an etched facet, which is arranged to change the direction of the first light B1 by an angle $\beta_1$ which is in the range of 70 to 110 degrees.

The nonlinear crystal NLC may be e.g. a periodically poled MgO-doped LiNbO$_3$ (magnesium oxide doped lithium niobate) crystal, or lithium tantalite, potassium titanyl phosphate (also known as KTP), periodically poled KTP, or lithium triborate (LBO).

The light source 400 may comprise a light emitting unit LD1 described e.g. in WO 2008/087253. The patent publication WO 2008/087253 is herein incorporated by reference.

Second pulsed light B2 may be generated in the waveguide 142 by second harmonic generation (SHG). A residual portion of the first light B1 and the generated second light B2 may impinge on the resonant grating G1. A portion of the first light B1 defined by the reflection band of the resonant grating G1 may be reflected back towards the nonlinear crystal NLC, wherein the second light B2 is transmitted through the grating G1. A portion of the reflected light may be guided back to the gain region 20 via the waveguide 142, via the light concentrating structure 120, and via the coupling structure M45.

It is emphasized that it is not necessary to couple all optical power of the reflected light into the waveguide 142 of the nonlinear crystal NLC, in order to obtain wavelength stabilization. However, the resonant grating G1 may be in the vicinity of the nonlinear crystal NLC in order to ensure sufficient optical feedback. The distance d1 between the nonlinear crystal NLC and the resonant grating G1 may be e.g. smaller than or equal to 1000 µm.

The distance d1 may also be e.g. smaller than or equal to ten times the thickness $d_{142}$ of the core of the waveguide 142 in order to ensure sufficient optical feedback. In particular, the distance d1 may be e.g. smaller than or equal to the thickness $d_{142}$ of the core of the waveguide 142. The waveguide 142 may be rather wide in the direction SY. $d_{142}$ refers to the smallest dimension of the core of the waveguide 142. The smallest dimension of the core may be e.g. in the range of 3 to 10 µm.

The light source 400 may also be arranged such that the distance d1 between the resonant grating G1 and the nonlinear crystal NLC is e.g. greater than or equal to 10 µm at each operating temperature of the light source 400. This ensures that the grating G1 and/or the nonlinear crystal NLC do not contact each other due to thermal expansion. The contact might damage the grating G1 and/or the nonlinear crystal NLC.

Alternatively, the resonant grating G1 may be directly attached to the nonlinear crystal NLC. If the diffractive features 71 are in contact with the crystal NLC this should be taken into consideration when selecting the dimensions and materials of the resonant grating G1.

The resonant grating G1 may be arranged to stabilize the optical frequency of said first light B1 by providing optical feedback R1 to the gain region 20 through the nonlinear crystal NLC. Consequently, this may provide very short pulses and maximum intensity of the first light B1 in the nonlinear crystal. Yet, the resonant grating G1 may be positioned such that the difference between the operating temperature of said nonlinear medium NLC and the operating temperature of said resonant grating G1 is smaller than or equal to 10° C. in steady state operation when the light source 400 is operated at maximum power. Thus, the spectral position $\lambda_{PB}$ of the reflection band and the wavelength of the first light B1 may follow the spectral position $\lambda_{CE}$ of maximum conversion efficiency of the nonlinear crystal NLC.

Optical feedback coupled through the nonlinear crystal NLC may facilitate stable operation of the light source 400. Attenuation at high intensity levels in the crystal NLC is high, and attenuation at low intensity levels in the crystal NLC is low, respectively. This effect may stabilize the output power of the light source 400.

Optical feedback coupled through the nonlinear crystal NLC may facilitate stable operation in a wide range of operating powers of the light source 400. Intensity of reflected light coupled into the gain region 20 through the crystal NLC is attenuated less at low power levels. This may facilitate stable operation at low power levels.

Very short light pulses may be generated by a Q-switched arrangement when the frequency-selective optical feedback R1 is provided to the gain region 20 through the nonlinear crystal NLC by the resonant grating G1. The conversion efficiency of the crystal NLC depends on the intensity of the light B1 in non-linear manner. Thus, the reflectivity of the combination of the crystal and the grating G1 may be substantially reduced at high intensity values, which may allow generation of very short light pulses by cavity dumping. Optical feedback provided by the combination of the nonlinear crystal NLC and the resonant grating G1 is substantially smaller for the high-intensity light pulses than for the low-intensity light. Thanks to the intensity-dependent feedback, the fall time of the generated pulses may be very short. Consequently, very short and intense light pulses of visible light may be generated at a high efficiency.

The light source 400 comprising the saturable absorber 40 may be adapted to emit short light pulses at a high repetition rate. The successive light pulses have a short coherence length and they are substantially non-coherent with each other. Consequently, the pulsed light creates a lower speckle contrast than light provided by a continuously operating laser. An image formed by coherent light typically creates annoying speckle patterns when viewed visually.

The speckle contrast may be substantially reduced when the light source provides short light pulses at a high repetition rate. Thanks to the short duration of the pulses, the pulses have a broad spectrum which further reduces speckle contrast.

Thanks to the pulsed operation, the peak power may be substantially higher than the peak power of a continuously operating laser device, when the devices have the same average power. The peak optical power may be e.g. greater than 10 times the average optical power, or even greater than 100 times the average optical power. Consequently, the efficiency of frequency conversion in the nonlinear medium may be substantially increased.

Thanks to the pulsed operation at a high repetition rate, the light source 400 may consume less electrical power than a continuously operating device providing the same optical power at the same visible wavelength. Consequently, the light source 400 may operate at a lower temperature and the operating reliability may be higher. Consequently, the weight and the size of the required cooling units may be reduced.

Thanks to the inclined reflecting structure M45, the operation of light emitting unit LD1 may be tested already on a wafer, before individual units M45 are separated from the wafer.

Thanks to the inclined reflecting structure M45, the nonlinear crystal NLC comprising nonlinear medium may be aligned easily with respect to the light emitting unit LD1.

The implementation of the gain region 20, the saturable absorber 40, the inclined reflecting structure M45, and the light-concentrating structure 120 on the common substrate may provide considerable stability and easier module packaging when compared with linear edge-emitting arrangements.

Figure 7B:
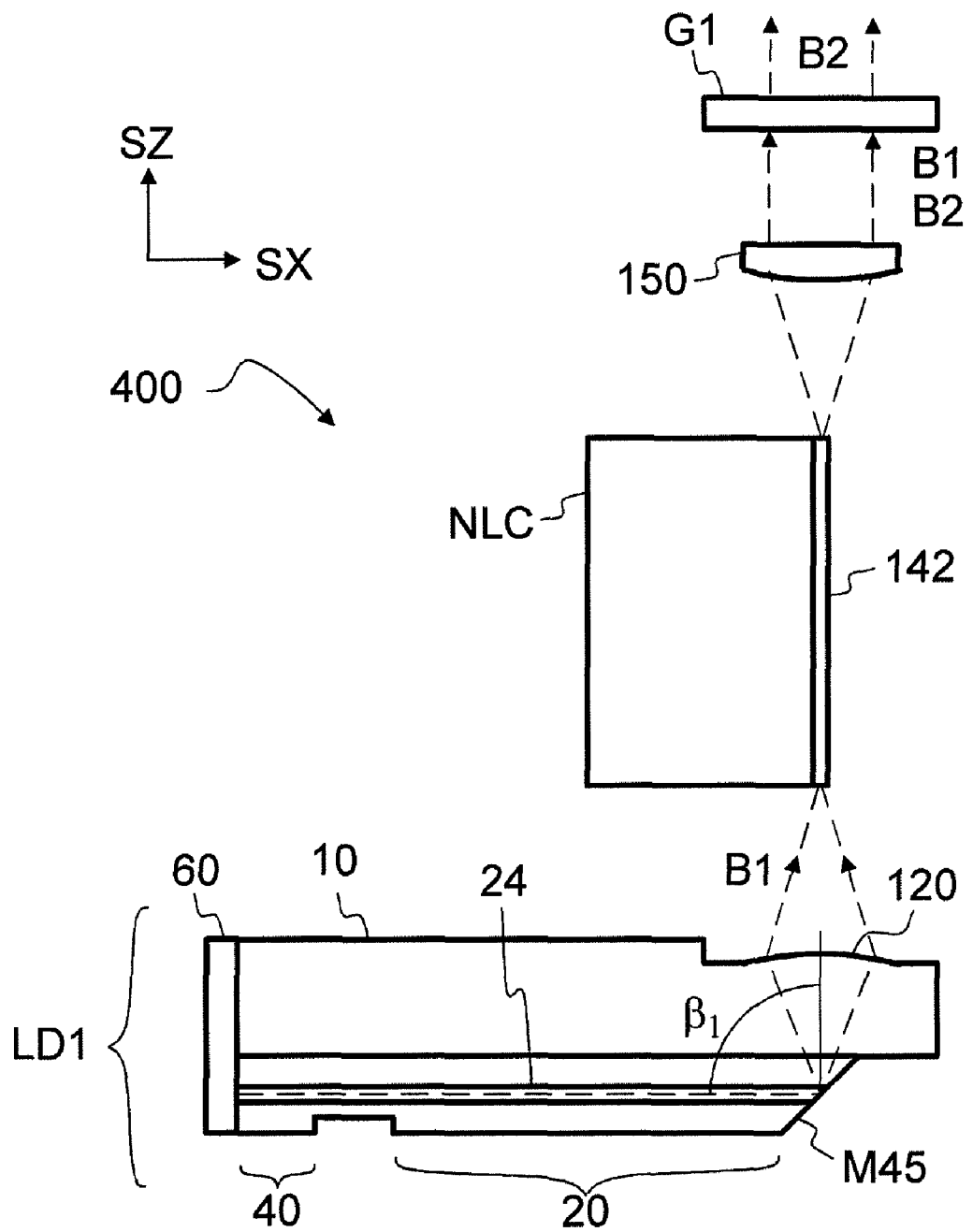
FIG. 7b shows a light source comprising a light-collimating structure arranged to collimate light impinging on a resonant grating.

Referring to FIG. 7b, the light source 400 may comprise a collimating structure 150, which is arranged to collimate first light B1 impinging on the resonant grating G1. This may facilitate providing a narrow reflection band.

However, the arrangement of FIG. 7b may be more complex and expensive than the arrangement of FIG. 7a.

The collimating structure 150 may be a refractive lens. In particular, the material of the collimating structure 150 may be used as the substrate of a resonant grating. In particular, diffractive features of a resonant grating may be implemented on a surface of the collimating structure 150.

Figure 8:
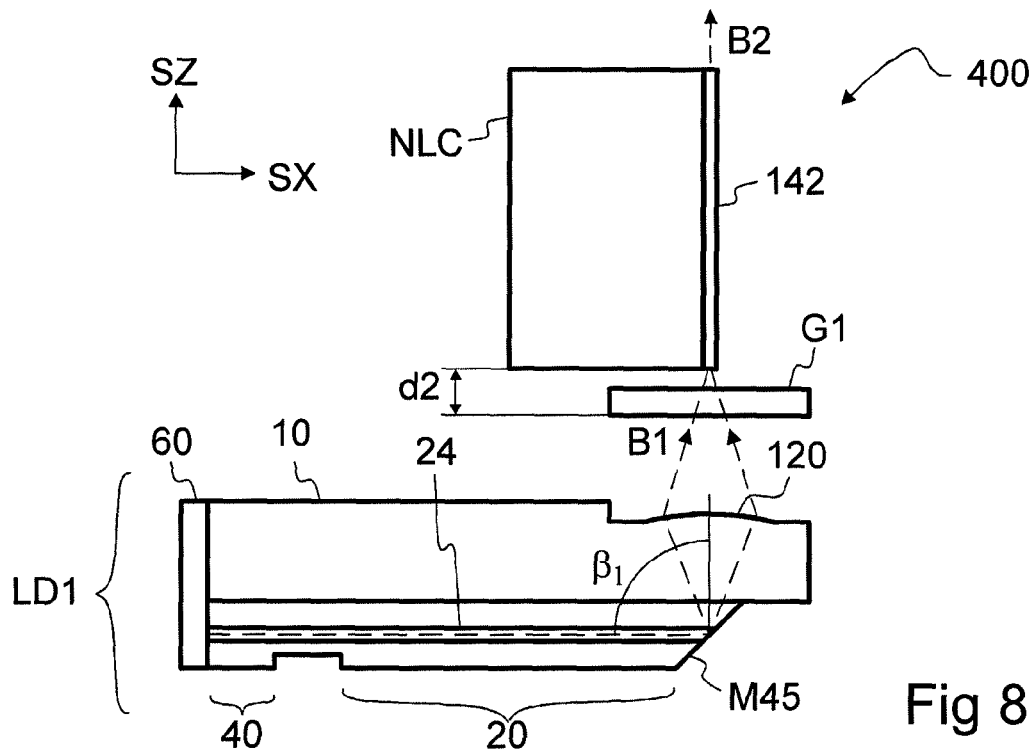
FIG. 8 shows a light source comprising a saturable absorber, gain medium, nonlinear crystal, and a resonant grating, wherein said resonant grating is positioned between the gain medium and the nonlinear crystal.

Referring to FIG. 8, a resonant grating G1 may also be positioned between the gain region 20 and the nonlinear crystal NLC. Also in this case, the distance between the resonant grating G1 and the nonlinear crystal NLC may be small in order to maximize feedback. The dimension d2 between the nonlinear crystal NLC and the diffractive features 71 of the resonant grating G2 may be e.g. smaller than or equal to ten times the thickness $d_{142}$ of the core of the waveguide 142.

Positioning of the resonant grating G1 between the light emitting unit LD1 and the nonlinear crystal may provide a strong feedback. However, in that case the resonant grating G1 may reduce the intensity of the first light B1 coupled into the nonlinear medium NLC, thereby reducing the conversion efficiency.

Referring back to FIGS. 7a and 7b, a resonant grating G1 positioned after the nonlinear medium NLC does not reduce the conversion efficiency.

FIG. 7a-8 show a light source 400, which have a folded configuration. The light sources 400 of FIGS. 7a-8 have a folded optical cavity.

Figure 9:
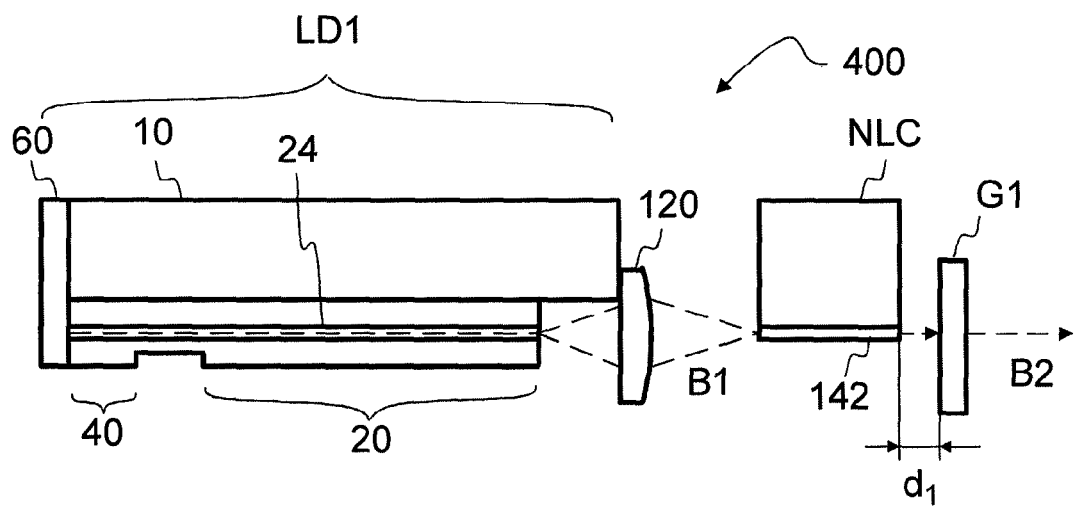
FIG. 9 shows a light source in a straight configuration, said light source comprising a saturable absorber, gain medium, nonlinear crystal, and a resonant grating, wherein said resonant grating is arranged to provide feedback through said nonlinear crystal.

Referring to FIG. 9, the light source 400 may also have a straight configuration. However, in that case the light source 400 is less compact than in FIGS. 7a-8, and the alignment of the optical components may be more difficult.

The light emitting units LD1 shown in FIGS. 7a-9 may be arranged to provide a highly polarization-stable output for a periodically poled nonlinear crystal NLC.

The light sources 400 of FIGS. 7a-9 may also comprise a nonlinear crystal NLC which does not have a waveguiding layer 142.

The light emitting unit LD1 may also be e.g. a VCSEL (vertical-cavity surface-emitting) laser or a DPSS (diode pumped solid state) laser.

First light B1 emitted from a gain region 20 and transmitted through a nonlinear crystal NLC may form a first light beam B1. The diameter of a light beam may be defined e.g. by a circle which encloses 90% of the optical power of the first light beam B1. The distance d1 between the nonlinear crystal NLC and the resonant grating G1 may be e.g. smaller than or equal to the diameter of said first light beam B1 at the output surface of the nonlinear crystal NLC, so as to ensure sufficient optical feedback.

Infrared light transmitted to the eye of a viewer may be harmful. Infrared light refers to electromagnetic radiation whose wavelength is longer than 760 nm in vacuum. The resonant grating G1 may be arranged to absorb and/or reflect infrared light. In particular, the substrate 70 of the resonant grating G1 may be arranged to absorb infrared light at the wavelength of the first light B1. In particular, the resonant grating G1 may be arranged such that less than 10% of first light B1 impinging on the resonant grating G1 is transmitted through the resonant grating G1.

Figure 10:
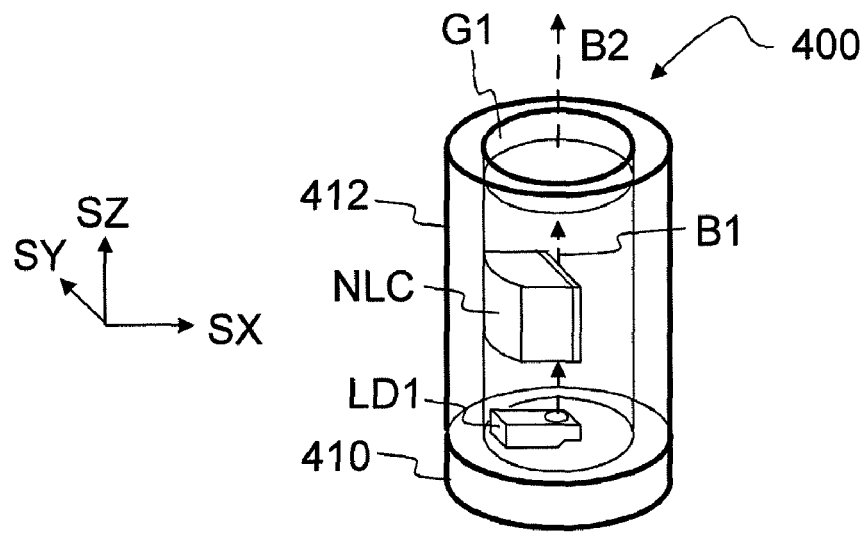
FIG. 10 shows an encapsulated light source.

Referring to FIG. 10, the light emitting unit LD1 and the nonlinear medium NLC may be positioned in a housing comprising e.g. a shell 412 and a base 410. A resonant grating G1 may be used as a window of the housing. In particular, the grating G1 may be attached to the housing, in particular to the shell 412, so as to form a hermetic (gas-tight) enclosure for the nonlinear medium NLC. The base and/or the shell 412 may be used as a heat sink. The housing, in particular the shell 412, may be arranged to equalize the temperatures of the resonant grating G1 and the nonlinear crystal NLC.

The difference between the temperature of the resonant grating G1 and the temperature of the nonlinear crystal NLC may be smaller than or equal to 10° C., advantageously smaller than or equal to 3° C., and preferably smaller than or equal to 1° C. in steady state operation when the light source 400 is operated at maximum power rated for continuous operation.

Figure 11A:
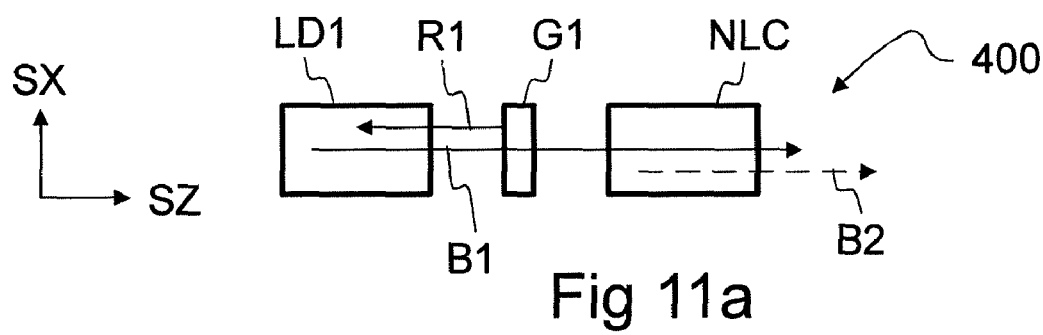
FIG. 11a shows a light source comprising a resonant grating positioned between a light emitting unit and a nonlinear crystal.

Referring to FIG. 11a, the resonant grating G1 may be positioned between a light emitting unit LD1 and a nonlinear medium NLC such that the resonant grating G1 provides a narrowband reflected light R1 back to the gain region 20 of the light emitting unit LD1 (see also FIG. 8). For example, a light emitting unit LD1 may emit first light pulses at 1064 nm, and a nonlinear crystal NLC may generate second light pulses at 512 nm.

Figure 11B:
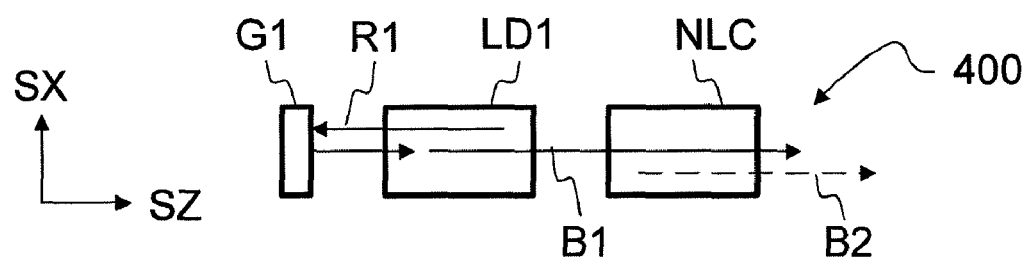
FIG. 11b shows a light source, wherein the gain medium of a light emitting unit is located between a resonant grating and a nonlinear crystal.

Referring to FIG. 11b, a resonant grating G1 may be arranged to operate as a back mirror 60 of a light emitting unit LD1. In other words, the gain region 20 may be positioned between a resonant grating G1 and the nonlinear medium NLC.

Referring to FIGS. 12a-12d, resonant gratings G1 may also be used together with optically pumped gain media.

Figure 12A:
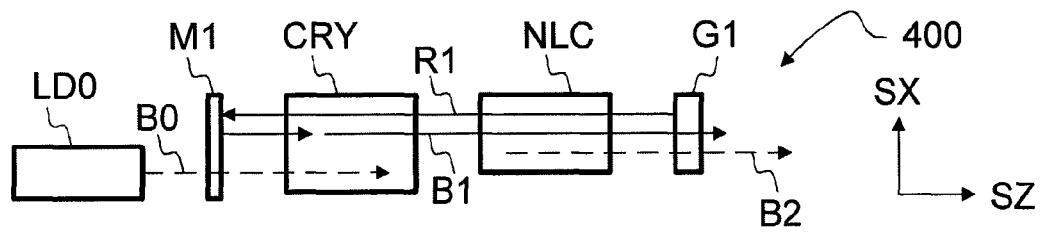
FIG. 12a shows a light source comprising an optically pumped gain medium, wherein a resonant grating is arranged to provide feedback through a nonlinear crystal.

FIG. 12a shows an optically pumped light source 400 comprising a pump light emitting unit LD0, optically pumped gain medium CRY, and a nonlinear medium NLC. The optically pumped gain medium CRY may be e.g. a neodymium doped yttrium aluminium garnet crystal, which is also known as a $Nd:Y_3Al_5O_{12}$ crystal or Nd:YAG crystal.

The optically pumped gain medium CRY may also be a $Nd:YVO_4$ crystal. (neodymium doped yttrium vanadate), Nd:GdVO4 crystal(neodymium doped gadolinium vanadate), or Nd:LuVO4 (neodymium doped lutetium vanadate).

The pump light emitting unit LD0 may emit pump light B0 e.g. at 808 nm. The pump light B0 is transmitted into the gain medium CRY. The gain medium CRY is positioned in an optical cavity defined by the resonant grating G1 and a spectral mirror M1. The resonant grating G1 is arranged to provide narrowband reflected light R1 at the wavelength of first light B1, e.g. at 1064 nm. First light B1 at 1064 nm is generated in the gain medium CRY, and coupled into the nonlinear medium NLC where it generates second light B2, e.g. at 512 nm. The second light B2 is transmitted through the resonant grating G1.

The spectral mirror M1 may e.g. a reflective broadband filter, which reflects light at 1064 nm and transmits light at 808 nm.

The spectral mirror M1 may also be attached to the optically pumped gain medium CRY. In particular, the spectral mirror M1 may be implemented on the input facet of a lasing crystal CRY, e.g. by dielectric multilayer coatings.

Figure 12B:
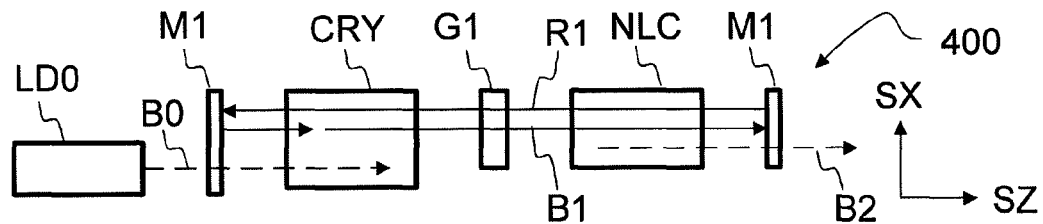
FIG. 12b shows a light source comprising an optically pumped gain medium, wherein a resonant grating is positioned between said gain medium and a nonlinear medium.

Referring to FIG. 12b, the resonant grating G1 may be positioned between optically pumped gain medium CRY and a nonlinear medium NLC. The gain medium CRY is positioned in an optical cavity defined by a first spectral mirror M1 and the resonant grating G1. The light source 400 may further comprise a second spectral mirror M1 to eliminate first light B1 from the output beam B2.

The first spectral mirror M1 may be attached to the optically pumped gain medium CRY. In particular, the spectral mirror M1 may be implemented on the input facet of a lasing crystal CRY, e.g. by dielectric multilayer coatings.

The second spectral mirror M1 may be attached to the nonlinear crystal NLC. In particular, the second spectral mirror M1 may be implemented on the output facet of the nonlinear crystal NLC, e.g. by dielectric multilayer coatings.

Figure 12C:
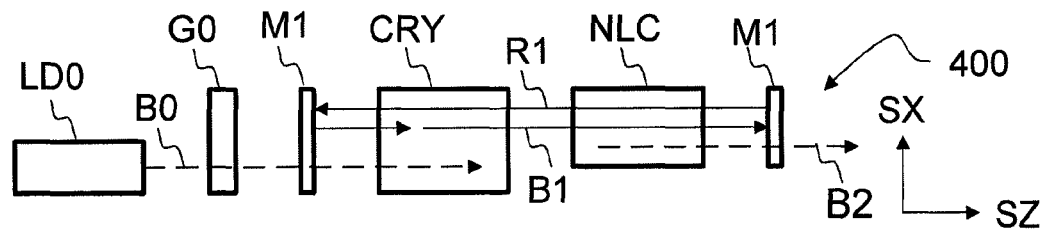
FIG. 12c shows a light source comprising an optically pumped gain medium, wherein a resonant grating is arranged to stabilize the wavelength used for pumping said gain medium.
Figure 12D:
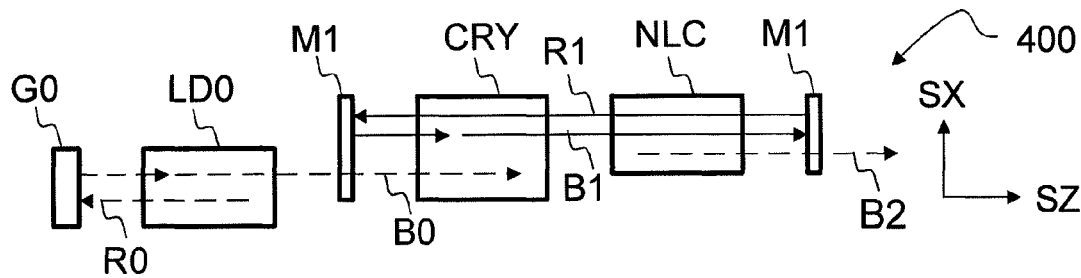
FIG. 12d shows a light source comprising an optically pumped gain medium, wherein a resonant grating is arranged to stabilize the wavelength used for pumping said gain medium.

Referring to FIGS. 12c and 12d, a resonant grating G0 may also be arranged to provide narrowband reflection at the wavelength of the pump light B0, in order to stabilize the wavelength of the pump light B0 to a value which is within a peak of the absorption spectrum. R0 denotes pump light propagating in a reverse direction.

In FIGS. 12c and 12d, the spectral mirrors M1 may be arranged to reflect light at the wavelength of the first light B1. In particular, a reflective coating may be implemented on the resonant grating G1.

The resonant grating G0 shown in FIG. 12c may also be a two-sided grating. In that case the mirror M1 between then resonant grating G0 and the lasing crystal CRY may be omitted. Two gratings may be implemented on the same substrate 70 so as to provide a two sided resonant grating. Diffractive features on a first side may be used to implement a resonant grating which provides narrowband reflection at the wavelength of pumping light B0. Diffractive features on a second side may be used to implement a resonant grating which provides narrowband reflection at the wavelength of the first light B1.

Figure 13A:
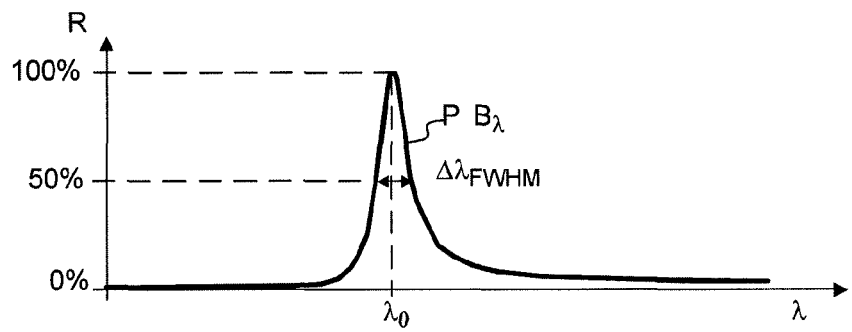
FIG. 13a shows reflectivity of a resonant grating as a function of wavelength.

Referring to FIG. 13a, a resonant grating G1 has a spectral passband $PB_\lambda$. The spectral passband $PB_\lambda$ has a FWHM width $\Delta\lambda_{FWHM}$ when the input angle $\theta=\theta_0$. Maximum reflectance R is provided at the central wavelength $\lambda_0$ when the input angle $\theta$ of the incident light B1 is equal to a nominal angle $\theta_0$.

Figure 14:
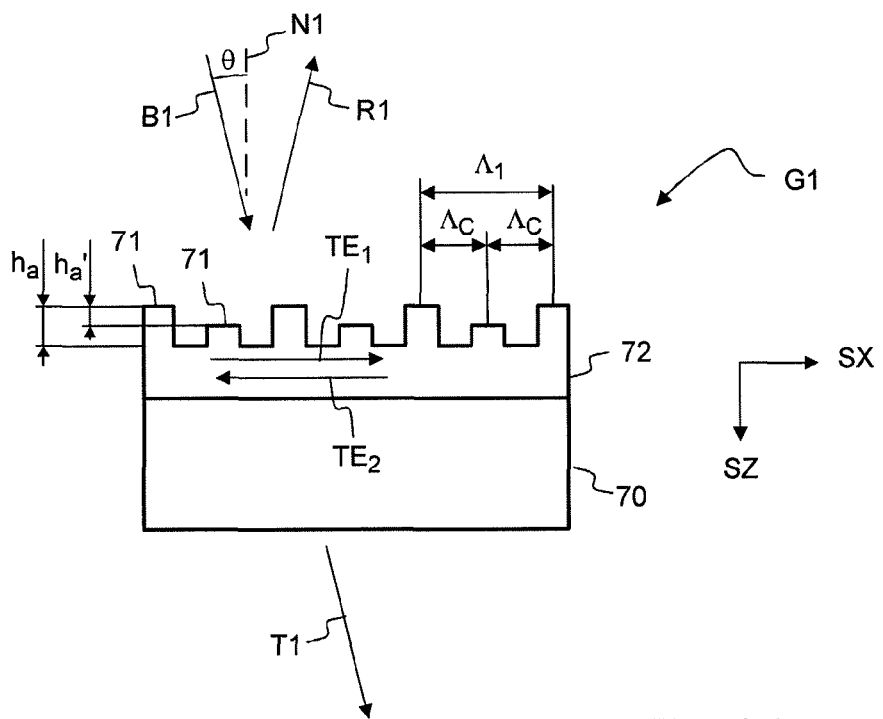
FIG. 14 shows, in a side view, excitation of two counter-propagating modes in a doubly periodic resonant grating.

The input angle $\theta$ denotes an angle between the direction of the incident beam B1 and the normal N1 of the plane of the grating G1 (See FIG. 14). The normal of the plane is parallel to the direction SZ when the plane of the grating G1 is defined by the directions SX and SY.

The central wavelength $\lambda_0$ shown in FIG. 13a may be equal to the spectral position $\lambda_{PB}$ of the reflection band shown in FIG. 3 when the input angle $\theta$ of the incident light B1 is equal to a nominal angle $\theta_0$, and when the curves of FIGS. 3 and 13a correspond to operation at the same temperature.

Figure 13B:
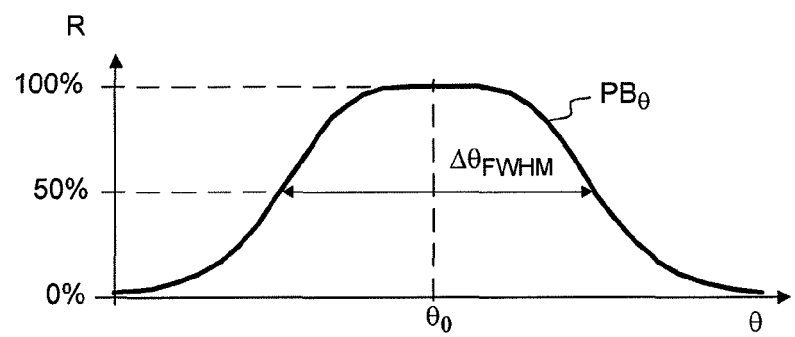
FIG. 13b shows reflectivity of a resonant grating as a function of the input angle.

Referring to FIG. 13b, the resonant grating G1 of FIG. 13a has also an angular passband $PB_\theta$, which corresponds to the spectral passband $PB_\lambda$. The angular passband $PB_\theta$ has a FWHM width $\Delta\theta_{FWHM}$ when the wavelength of the indicent light B1 is equal to $\lambda_0$. The angular width $\Delta\theta_{FWHM}$ of the passband $PB_\theta$ when $\lambda=\lambda_0$ may also be called as the angular tolerance of the grating G1. Maximum reflectance R is provided at the nominal angle $\theta_0$ when the wavelength of the indicent light B1 is equal to $\lambda_0$.

The light source 400 may comprise a resonant grating G1 which has a narrow spectral width $\Delta\lambda_{FWHM}$ and a wide angular tolerance $\Delta\theta_{FWHM}$ in the vicinity of the operating point ($\lambda_0$, $\theta_0$). Consequently, a large portion of the energy of the incident beam B1 may be utilized for optical feedback and/or the beam B1 may have a large divergence.

For example, the width $\Delta\theta_{FWHM}$ of the angular passband $PB_\theta$ of the resonant grating G1 may be smaller than the width $\Delta\lambda_{FWHM}$ of the spectral passband $PB_\lambda$ of the resonant grating G1 multiplied by a factor 2 degrees/nm.

For example, the width $\Delta\theta_{FWHM}$ of the angular passband $PB_\theta$ of the resonant grating G1 may be smaller than 1 nm, and the width $\Delta\lambda_{FWHM}$ of the spectral passband $PB_\lambda$ of the resonant grating G1 may be greater than 2 degrees. In particular, the width $\Delta\theta_{FWHM}$ of the angular passband $PB_\theta$ of the resonant grating G1 may be smaller than 0.5 nm, and the width $\Delta\lambda_{FWHM}$ of the spectral passband $PB_\lambda$ of the resonant grating G1 may be greater than 1 degrees The resonant grating G1 of the light source 400 may be dimensioned such that the nominal input angle $\theta_0=0$ degrees. Thus, the reflected beam R1 may propagate along the same path as the incident beam B1, and the reflected beam R1 may be effectively coupled back into the nonlinear medium NLC.

In an embodiment, the light source 400 does not comprise collimating optics between the crystal NLC and the resonant grating G1 (FIG. 7a).

The angular tolerance $\Delta\theta_{FWHM}$ of a resonant grating G1 may be increased without increasing the spectral width $\Delta\lambda_{FWHM}$ by introducing additional periodicity. In particular, a resonant grating G1 may be doubly periodic and/or a resonant grating G1 may be periodic in two dimensions SX and SY in order to provide improved angular tolerance $\Delta\theta_{FWHM}$.

The diffractive features 71 of a grating G1 cause periodic perturbation of the waveguide 72 (waveguiding layer). The perturbation corresponds to a spatially periodic variation of permittivity $\in(x)$ according to the following Fourier series representation:

$$\varepsilon(x) = \sum_{q=-\infty}^{\infty} \varepsilon_q \exp\left(iq\frac{2\pi x}{\Lambda_1}\right) \tag{1}$$

where q is an integer, i denotes the imaginary unit, x denotes position coordinate in the direction SX, and $\Lambda_1$ denotes the longest period of the grating G1. The first Fourier coefficient $\in_1$ determines the (complex) amplitude of a variation associated with the period $\Lambda_1$. The second Fourier coefficient $\in_2$ determines the (complex) amplitude of a variation associated with the period $\Lambda_1/2$. Excitation of a first guided mode $TE_1$ by the incident light B1 may be governed by the first Fourier coefficient $\in_1$, and coupling of the first guided mode $TE_1$ to a second guided mode $TE_2$ may be governed by the second Fourier coefficient $\in_2$.

Referring to FIG. 14, the in-coming beam B1 having an angular frequency $\omega$ may excite a first guided mode $TE_1$ according to the following equation:

$$\alpha_{TE1}(\omega) = \alpha_{B1}(\omega)\sin\theta + mK_1 \tag{2}$$

where $\alpha_{TE1}$ denotes the wave vector of the guided mode $TE_1$ propagating in the waveguide 72, $\alpha_{B1}$ denotes the wave vector of the in-coming beam B1, $\theta$ denotes the input angle, and m denotes an integer. The first reciprocal lattice vector $K_1$ is equal to $2\pi/\Lambda_1$.

A doubly periodic resonant grating G1 may have a shorter period $\Lambda_c$ and a longer period $\Lambda_1$ such that $\Lambda_c=\Lambda_1/2$. Now, the first guided mode $TE_1$ may be coupled to a second guided mode $TE_2$ via a second reciprocal lattice vector $K_c$ according to the Bragg reflection equation:

$$\alpha_{TE1}(\omega) - \alpha_{TE2}(\omega) = K_C \tag{3}$$

where $\alpha_{TE2}$ denotes the wave vector of the second guided mode $TE_2$. $K_c=2\pi/\Lambda_c$.

When the input angle $\theta$ is substantially equal to zero (normal incidence), the period $\Lambda_c$ may be selected such that the wave vector $\alpha_{B1}$ of the first guided mode $TE_1$ is substantially equal to $\pi/\Lambda_c$, i.e. $\alpha_{TE1} \approx K_c/2$. In this case the second guided mode $TE_2$ fulfilling the equation (3) has a wave vector $\alpha_{TE2} \approx -K_c/2$. Thus, the wave vectors $\alpha_{TE1}$ and $\alpha_{TE2}$ reside in the vicinity of the Bragg planes $\pm K_c/2$.

The second Fourier coefficient $\in_2$ has an effect on the width of a forbidden gap in the vicinity of the Bragg planes $\pm K_c/2$. The forbidden gap has an effect on the shapes of the dispersion curves of the modes $TE_1$ and $TE_2$. A wider forbidden gap typically provides a flatter dispersion curve. Consequently, increasing the magnitude of the second Fourier component $\in_2$ may increase the angular tolerance $\Delta\theta_{FWHM}$.

The first Fourier coefficient $\in_1$ of the grating G1 is associated with the period $\Lambda_1$ and the reciprocal lattice vector $K_1$. The magnitude of the first Fourier coefficient $\in_1$ determines coupling of light into the waveguide 72. In particular, the spectral width $\Delta\lambda_{FWHM}$ of the passband may be adjusted by selecting the magnitude of the first Fourier coefficient $\in_1$.

The second Fourier coefficient $\in_2$ of the grating G1 is associated with the period $\Lambda_c$ and the reciprocal lattice vector $K_c$. The magnitude of the second Fourier coefficient $\in_2$ determines interaction between the guided modes $TE_1$, $TE_2$. In particular, the angular tolerance $\Delta\theta_{FWHM}$ may be adjusted by selecting the magnitude of the second Fourier coefficient $\in_2$.

In case of the doubly periodic grating, the magnitude of the second Fourier coefficient $\in_2$ may be increased without increasing the magnitude of the first Fourier component $\in_1$. This allows increasing the angular tolerance $\Delta\theta_{FWHM}$ without increasing the spectral width $\Delta\lambda_{FWHM}$. The dimensions and the materials of the grating G1 may be selected such that the magnitude of the second Fourier coefficient $\in_2$ may be substantially greater than the magnitude of the first Fourier coefficient $\in_1$. In particular, the magnitude of the second Fourier coefficient $\in_2$ may be greater than or equal to ten times the magnitude of the first Fourier coefficient $\in_1$.

The doubly periodic resonant grating G1 may have the shorter period $\Lambda_c$ and the longer period $\Lambda_1$. The shorter period $\Lambda_c$ may be implemented simply by selecting the positions of diffractive features 71 such that the distance between adjacent diffractive features 71 is approximately equal to $\Lambda_c$. The longer period $\Lambda_1$ may be implemented e.g. by spatially varying the height ($h_a$, $h_a'$) of diffractive features 71 (FIG. 14) and/or by spatially varying the width ($w_3$, $w_4$) of the diffractive features 71 (FIG. 15a).

Figure 15A:
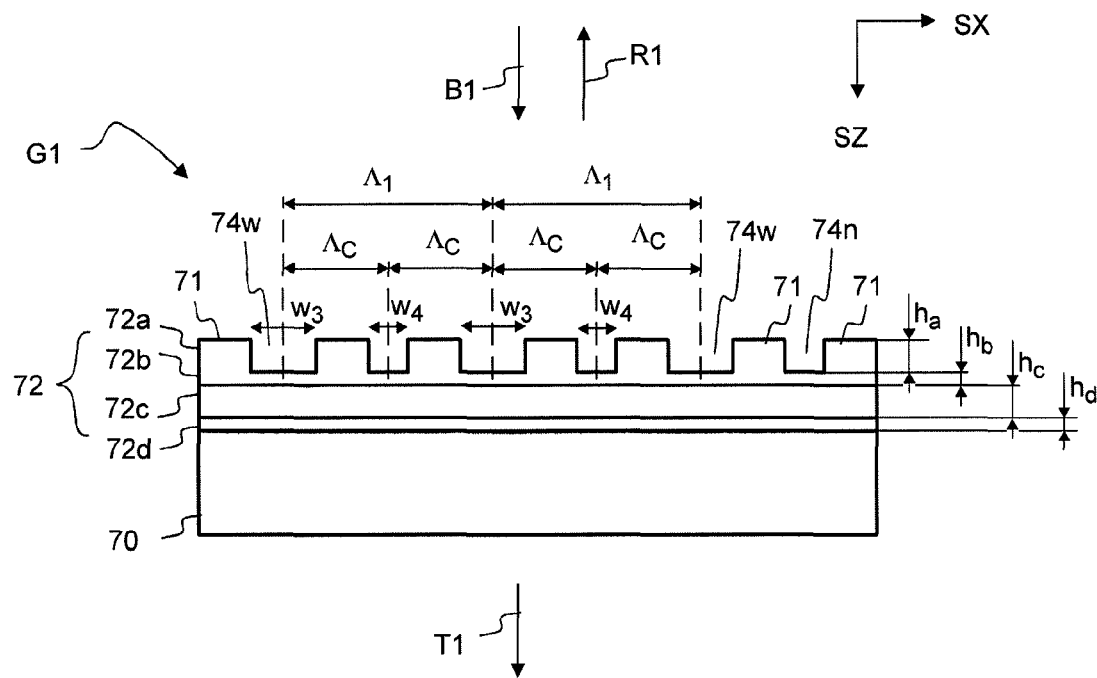
FIG. 15a shows, in a side view, a resonant grating having a doubly periodic structure.
Figure 15B:
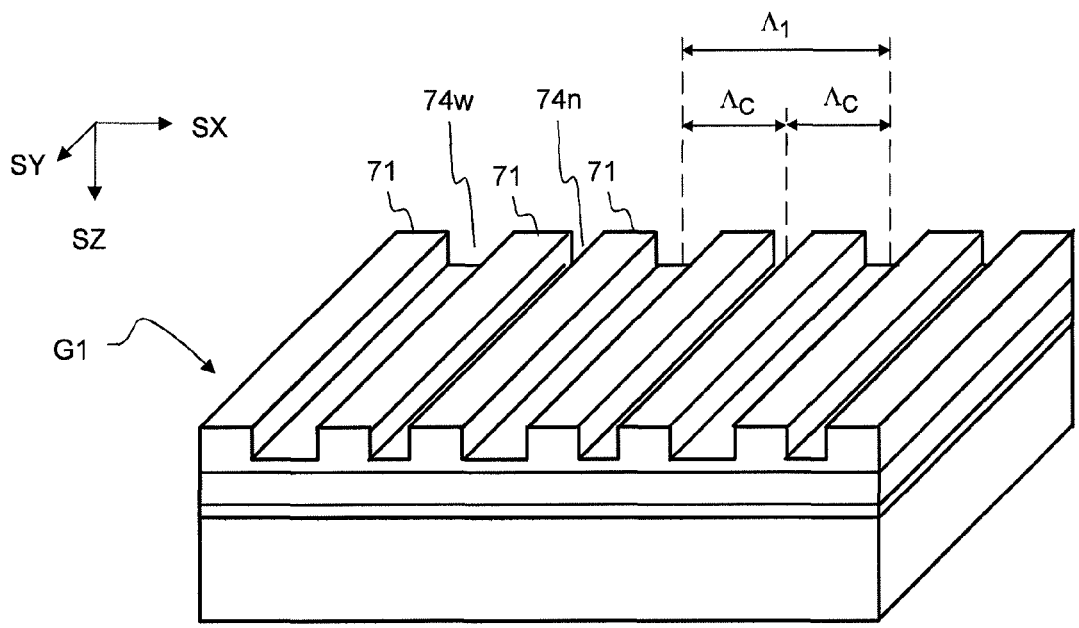
FIG. 15b shows, in a three dimensional view, the resonant grating of FIG. 15a, FIG. 16 shows, in a side view, a resonant grating having a smooth input surface.

FIGS. 15a and 15b show a doubly periodic resonant grating G1 where the width of the diffractive grooves 72w, 72n is varied. Each ridge 71 is located between an adjacent wider groove 72w and an adjacent narrower groove 72n. $w_3$ denotes the width of the wider grooves 72w, and $w_4$ denotes the width of the narrower grooves 72n. The ratio $w_3/w_4$ is greater than one. The ratio $w_3/w_4$ may be e.g. in the range of 1.1 to 1.5. In this case the longer period $\Lambda_1$ denotes a distance between the centers of wider grooves 72w. The shorter period $\Lambda_c$ denotes a distance between the center of a wider groove 72w and the center of a narrower groove 72n. $\Lambda_c$ is equal to 0.5 times $\Lambda_1$.

The modulation associated with the period $\Lambda_1$ is responsible for excitation of the guided mode $TE_1$, and the modulation associated with the period $\Lambda_c$ is responsible for coupling the guided mode $TE_1$ to the guided mode $TE_2$. The first Fourier coefficient $\in_1$ may be adjusted e.g. by selecting the height $h_a$ of the protrusions 71, and the second Fourier component $\in_2$ may be adjusted e.g. by selecting the value of ratio $w_3/w_4$. Consequently, the angular tolerance $\Delta\theta_{FWHM}$ and the spectral bandwidth $\Delta\lambda_{FWHM}$ may be tailored separately.

The diffractive ridges 71 may be substantially linear and substantially parallel (FIG. 15b).

The waveguide 72 may comprise sub-layers 72a, 72b, 72c, 74d implemented on a substrate 70. The sub-layers 72a, 72b, 72c, 74d may have heights $h_a$, $h_b$, $h_c$, $h_d$, respectively. The uppermost layer 72 refers to the diffractive ridges 71. The height $h_a$ of the uppermost layer 72a is equal to the height of the diffractive ridges 71, i.e. equal to the depth of the grooves 74w, 74n. The layer 72a may have a refractive index $n_a$. The layer 72a may have a refractive index $n_a$, the layer 72b may have a refractive index $n_b$, the layer 72c may have a refractive index $n_c$, the layer 72d may have a refractive index $n_d$, and the substrate 70 may have a refractive index $n_S$.

At least one of the layers 72a, 72b, 72c, 74d may have a refractive index, which is greater than the refractive index $n_A$ of the substrate 70 in order to provide the waveguide 72.

In particular, the layers 72a, 72b and 72d may have a refractive index ($n_a$, $n_b$, $n_d$) which is greater than the refractive index $n_A$ of the substrate 70. The refractive index $n_c$ of the intermediate layer 72c may be lower than the refractive index of the layers 72a, 72b and 72d.

The resonant grating G1 may comprise several stacked waveguiding layers 72, which interact with each other. One or more material layers 72a, 72b, 72c, 72d may be deposited on top of a substrate 70 to implement the one or more waveguiding layers 72. The use of two or more layers may provide additional degrees of freedom to select the spectral properties of the grating G1.

The resonant grating G1 may also be designed such that the nominal input angle $\theta_0$ is different from zero.

Figure 16:
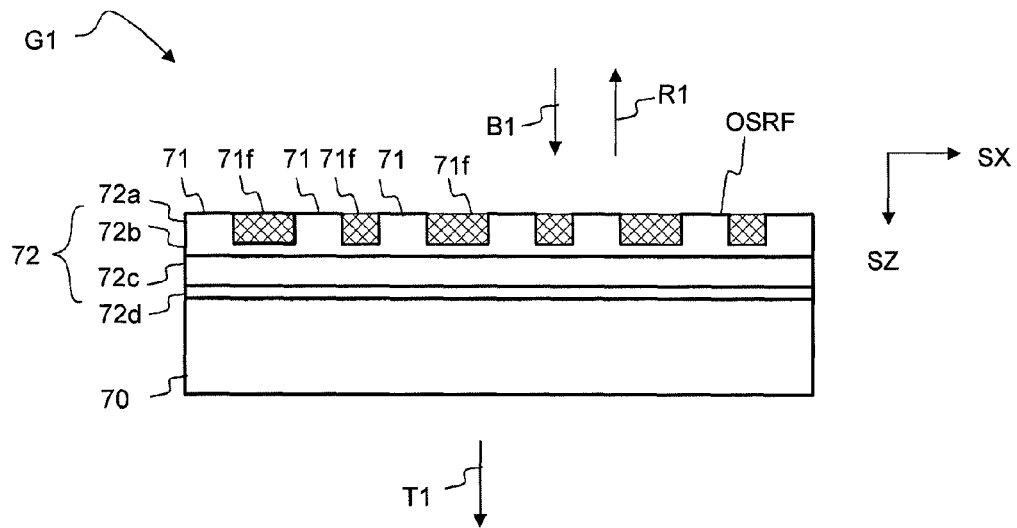

Referring to FIG. 16, the grooves or gaps between diffractive features 71 may be filled with a material 71f so as to provide a smooth surface OSRF. The permittivity of the filler material 71f should be different from the permittivity of the diffractive features 71. In other words, the resonant grating G1 may be implemented as a phase grating instead of a surface relief grating.

Light B1 may be optically coupled from the nonlinear crystal NLC to the grating G1 through the surface OSRF by using a solid or liquid coupling medium. The coupling medium may be e.g. transparent adhesive. In other words, the coupling between the crystal NLC and the grating G1 may be implemented such that there is no gas or vacuum between the crystal NLC and the grating G1. The coupling medium may have an effect on the spectral properties of the grating G1. This effect may be taken into consideration when designing or selecting the grating G1.

The smooth surface OSRF may also be attached to a saturable absorber 40 of a light emitting unit LD1 in embodiments where the resonant grating G1 is used as a back reflector 60 (see e.g. FIG. 11b).

On the other hand, the surface OSRF may also be an outer surface exposed to gas or vacuum.

The surface OSRF may be covered with a further protective layer, if desired.

The smooth surface OSRF may be resistant to dirt and scratching.

Figure 17:
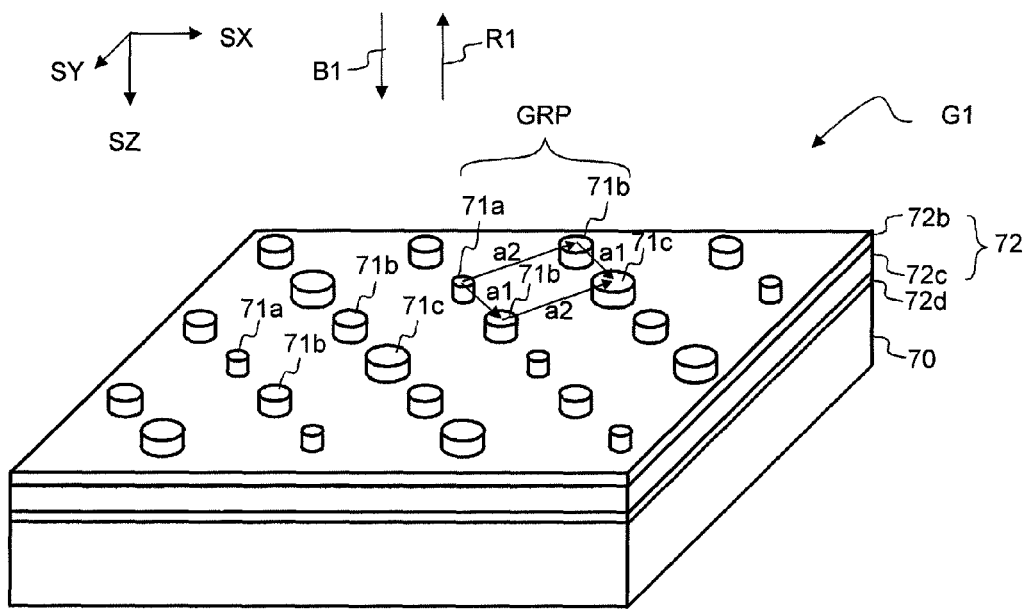
FIG. 17 shows, in a three dimensional view, a resonant grating comprising a plurality of diffractive features arranged in a two-dimensional array.

Referring to FIG. 17, the resonant grating G1 may comprise a plurality of studs or pits 71a, 71b, 71c arranged in a two-dimensional array.

An elementary group GRP may comprise diffractive features, which have different size and/or shape. In particular, the group GRP may comprise studs (or pits) 71a, 71b, 71c of three different size. A plurality of similar groups GRP may be arranged in a two-dimensional array. In particular, the groups GRP may be arranged in a rectangular or triangular array. The positions of the diffractive features 71 and the positions of the groups may be defined by vectors a1, a2. The grating G1 may comprise one or more material layers 72b, 72c, 72d implemented on a substrate 70.

The dimensions and positions of diffractive features 71a, 71b, 71c may be selected such that two mutually coupled guided modes $TE_1$, $TE_2$ having a predetermined frequency $\omega$ can be excited by an in-coming beam B1 having said predetermined frequency $\omega$. The coupled guided modes $TE_1$, $TE_2$ may propagate in different directions within the waveguide 72.

The spectral properties of the resonant grating G1 may be designed and/or optimized by using the rigorous diffraction theory. The design of doubly periodic resonant gratings and two-dimensional resonant gratings have been discussed e.g. in articles "Angular tolerant resonant grating filters under oblique incidence", by A. Sentenac and A.-L. Fehrembach, in J. Opt. Soc. Am A, Vol. 22, No. 3 March 2005, pp. 475-479, and "Increasing the angular tolerance of resonant grating filters with doubly periodic structures, in Optics Letters, Vol. 23, No. 15, Aug. 1, 1998, pp. 1149-1151.

The light source 400 may be used to implement e.g. a display device, in particular a virtual display device, or an image projector. The display device may be arranged to display graphics and/or text.

The light source 400 may comprise a light emitting unit LD1 described e.g. in WO 2008/087253. The patent publication WO 2008/087253 is herein incorporated by reference.

In particular, the light source 400 may comprise:
- a waveguide 24 having an electrically pumped gain region 20,
- a saturable absorber 40,
- a reflecting structure M45,
- a substrate 10,
- a nonlinear medium NLC, and
- a resonant grating G1, wherein said saturable absorber 40 and said gain region 20 are adapted to emit first light pulses B1 from an end of said waveguide, said reflecting structure M45 being adapted to reflect said first light pulses B1 into said nonlinear crystal NLC, said nonlinear crystal NLC being adapted to generate second light pulses B2 such that the optical frequency of said second light pulses B2 is two times the optical frequency of said first light pulses B1; said gain region 20, said saturable absorber 40 and said reflecting structure M45 being implemented on said substrate 10 such that said reflecting structure M45 is adapted to change the direction of said first light pulses B1 by an angle $\beta_1$ which is in the range of 70 to 110 degrees, the resonant grating G1 is arranged to stabilize the optical frequency of said first light B1 by providing optical feedback R1 to the gain region 20.

The various aspects of the invention are illustrated by the following examples:

EXAMPLE 1

A light source (400) comprising:
- a light emitting unit (LD1),
- a nonlinear medium (NLC), and
- a resonant grating (G1), wherein said light emitting unit (LD1) is arranged to emit first light (B1) into said nonlinear medium, said nonlinear medium is arranged to generate second light (B2) such that the optical frequency of said second light (B2) is higher than the optical frequency of said first light (B1), and the resonant grating (G1) is arranged to stabilize the optical frequency of said first light (B1) by providing optical feedback (R1) to said light emitting unit (LD1).

EXAMPLE 2

The light source (400) of example 1, wherein the spectral position ($\lambda_{CE}$) of maximum conversion efficiency of said nonlinear medium (NLC) substantially coincides with the spectral position ($\lambda_{PB}$) of the reflection band of said resonant grating (G1) in at least one operating point of the light source (400).

EXAMPLE 3

The light source (400) of example 1 or 2, wherein a spectral FWHM width of the reflection band of said resonant grating (G1) is in the range of 50% to 150% of a spectral FWHM width ($\Delta\lambda_{FWHM,CE}$) of a conversion efficiency curve of said nonlinear medium (NLC).

EXAMPLE 4

The light source (400) according to any of the examples 1 to 3, wherein the spectral shift of the spectral position of the maximum conversion efficiency of said nonlinear medium (NLC) per unit temperature change (nm/° C.) is in the range of 50% to 200% of the spectral shift of spectral position of the reflection band of said resonant grating (G1) per unit temperature change (nm/° C.).

EXAMPLE 5

The light source (400) according to any of the examples 1 to 4 wherein said nonlinear medium (NLC) and said resonant grating (G1) are positioned such that the difference between the operating temperature of said nonlinear medium (NLC) and the operating temperature of said resonant grating (G1) is smaller than or equal to 10° C. in steady state operation when the light source (400) is operated at maximum power.

EXAMPLE 6

The light source (400) according to any of the examples 1 to 5 wherein said light emitting unit (LD1) comprises:
- a waveguide (24) having an electrically pumped gain region (20), and
- a saturable absorber (40), wherein said saturable absorber (40) and said gain region (20) are arranged to emit said first light (B1) as pulsed light.

EXAMPLE 7

The light source (400) according to any of the examples 1 to 6 wherein said resonant grating (G1) is arranged to provide the optical feedback (R1) through said nonlinear medium (NLC).

EXAMPLE 8

The light source (400) of example 7 wherein said nonlinear medium (NLC) is a nonlinear crystal comprising a waveguide (142), and the distance between said nonlinear crystal (NLC) and said resonant grating (G1) is smaller than or equal to ten times the thickness (d142) of the core of said waveguide (142).

EXAMPLE 9

The light source (400) according to any of the examples 1 to 8 further comprising a collimating structure (150) arranged to collimate a part of said first light (B1) transmitted through said nonlinear medium (NLC).

EXAMPLE 10

The light source (400) according to any of the examples 1 to 9 wherein said resonant grating (G1) is an output window of a hermetically sealed housing (412, 410), wherein said housing (412, 410) comprises said nonlinear medium (NLC).

EXAMPLE 11

The light source (400) according to any of the examples 1 to 10 wherein said resonant grating (G1) has been implemented on a substrate (70), which absorbs light at the wavelength of said first light (B1).

EXAMPLE 12

The light source (400) according to any of the examples 1 to 11 wherein an angular width ($\Delta\theta_{FWHM}$) of an angular passband ($PB_\theta$) of the resonant grating (G1) may be smaller than a spectral width ($\Delta\lambda_{FWHM}$) of a corresponding spectral passband ($PB_\lambda$) of the resonant grating (G1) multiplied by a factor 2 degrees/nm.

EXAMPLE 13

The light source (400) according to example 12 wherein the spectral width ($\Delta\lambda_{FWHM}$) is smaller than 1 nm, and the angular width ($\Delta\theta_{FWHM}$) is greater than 2 degrees.

EXAMPLE 14

The light source (400) according to any of the examples 1 to 13 wherein a spatial perturbation of a waveguide (72) of the resonant grating (G1) corresponds to a spatial modulation of permittivity ($\in(x)$) such that excitation of a first guided mode ($TE_1$) by incident light (B1) is governed by a first Fourier coefficient ($\in_1$) of the spatial modulation and coupling of the first guided mode ($TE_1$) to a second guided mode ($TE_2$) is governed by a second Fourier coefficient ($\in_2$) of the spatial modulation, and the second Fourier coefficient ($\in_2$) is greater than the first Fourier coefficient ($\in_1$).

EXAMPLE 15

The light source (400) according to any of the examples 1 to 14 wherein the resonant grating (G1) has a doubly periodic diffractive structure.

EXAMPLE 16

The light source (400) according to any of the examples 1 to 15 wherein the resonant grating (G1) is a two-dimensional grating.

EXAMPLE 17

The light source (400) according to any of the examples 1 to 16 wherein gaps between diffractive protrusions (71) of the resonant grating (G1) have been filled so as to provide a smooth surface (OSRF).

EXAMPLE 18

A method for generating light (B2) by using a light source (400) comprising a light emitting unit (LD1), a nonlinear medium (NLC), and a resonant grating (G1), said method comprising:
  emitting first light (B1) from said light emitting unit (LD1) into said nonlinear medium (NLC),
  generating second light (B2) in said nonlinear medium (NLC) such that the optical frequency of said second light (B2) is higher than the optical frequency of said first light (B1), and
  providing optical feedback to said light emitting unit (LD1) by said resonant grating (G1) so as to stabilize the optical frequency of said first light (B1).

EXAMPLE 19

The method of example 18, wherein the spectral position ($\lambda_{CE}$) of maximum conversion efficiency of said nonlinear medium (NLC) substantially coincides with the spectral position ($\lambda_{PB}$) of the reflection band of said resonant grating (G1) in at least one operating point of the light source (400).

For the person skilled in the art, it will be clear that modifications and variations of the devices according to the present invention are perceivable. The figures are schematic. The particular embodiments described above with reference to the accompanying drawings are illustrative only and not meant to limit the scope of the invention, which is defined by the appended claims.

The invention claimed is:

1. A light source, comprising:
  a light emitting unit;
  a nonlinear medium; and
  a resonant grating,
  wherein said light emitting unit is arranged to emit a first light into said nonlinear medium, said nonlinear medium is arranged to generate a second light such that an optical frequency of said second light is higher than an optical frequency of said first light, wherein the resonant grating is arranged to stabilize the optical frequency of said first light by providing an optical feedback to said light emitting unit, and wherein the resonant grating is arranged to provide said optical feedback based on an excitation of a leaky waveguide mode in a waveguide of the resonant grating.

2. The light source according to claim 1, wherein a spectral position of maximum conversion efficiency of said nonlinear medium substantially coincides with a spectral position of a reflection band of said resonant grating in at least one operating point of the light source.

3. The light source according to claim 2, wherein a spectral FWHM width of the reflection band of said resonant grating is in a range of 50% to 150% of a spectral FWHM width of a conversion efficiency curve of said nonlinear medium.

4. The light source according to claim 3, wherein a spectral shift of maximum conversion efficiency of said nonlinear medium per unit temperature change is in a range of 50% to 200% of the spectral shift of the reflection band of said resonant grating per unit temperature change.

5. The light source according to claim 4, wherein said nonlinear medium and said resonant grating are positioned such that a difference between an operating temperature of said nonlinear medium and an operating temperature of said resonant grating is smaller than or equal to 10° C. in steady state operation when the light source is operated at maximum power.

6. The light source according to claim 2, wherein said light emitting unit comprises:
  a waveguide having an electrically pumped gain region, and
  a saturable absorber,
  wherein said saturable absorber and said gain region are arranged to emit said first light as pulsed light.

7. The light source according to claim 6, wherein said resonant grating is arranged to provide the optical feedback through said nonlinear medium.

8. The light source according to claim 7, wherein said nonlinear medium is a nonlinear crystal comprising a waveguide, and the distance between said nonlinear crystal and said resonant grating is smaller than or equal to ten times a thickness of the core of said waveguide.

9. The light source according to claim 7, further comprising:
  a collimating structure arranged to collimate a part of said first light transmitted through said nonlinear medium.

10. The light source according to claim 7, wherein said resonant grating comprises an output window of a hermetically sealed housing, wherein said housing comprises said nonlinear medium.

11. The light source according to claim 7, wherein said resonant grating is implemented on a substrate, which absorbs light at a wavelength of said first light.

12. The light source according to claim 2, wherein an angular width of an angular passband of the resonant grating is smaller than a spectral width of a corresponding spectral passband of the resonant grating multiplied by a factor 2 degrees/nm.

13. The light source according to claim 12, wherein the spectral width is smaller than 1 nm, and the angular width is greater than 2 degrees.

14. The light source according to claim 2, wherein a spatial perturbation of a waveguide of the resonant grating corresponds to a spatial modulation of permittivity such that excitation of a first guided mode by incident light is governed by a first Fourier coefficient of the spatial modulation and coupling of the first guided mode to a second guided mode is governed by a second Fourier coefficient of the spatial modulation, and the second Fourier coefficient is greater than the first Fourier coefficient.

15. The light source according to claim 2, wherein the resonant grating has a doubly periodic diffractive structure.

16. The light source according to claim 2, wherein the resonant grating is a two-dimensional grating.

17. The light source according to claim 2, wherein gaps between diffractive protrusions of the resonant grating have been filled so as to provide a smooth surface.

18. A method for generating light by using a light source comprising a light emitting unit, a nonlinear medium, and a resonant grating, said method comprising:
   emitting a first light from said light emitting unit into said nonlinear medium;
   generating a second light in said nonlinear medium such that an optical frequency of said second light is higher than an optical frequency of said first light; and
   providing optical feedback to said light emitting unit by said resonant grating so as to stabilize the optical frequency of said first light,
   wherein said optical feedback is provided based on excitation of a leaky waveguide mode in a waveguide of the resonant grating.

19. The method according to claim 18, wherein a spectral position of maximum conversion efficiency of said nonlinear medium substantially coincides with a spectral position of a reflection band of said resonant grating in at least one operating point of the light source.

* * * * *